US00RE33836E

United States Patent [19]

Resor, III et al.

[11] E Patent Number: Re. 33,836

[45] Reissued Date of Patent: Mar. 3, 1992

[54] APPARATUS AND METHOD FOR MAKING LARGE AREA ELECTRONIC DEVICES, SUCH AS FLAT PANEL DISPLAYS AND THE LIKE, USING CORRELATED, ALIGNED DUAL OPTICAL SYSTEMS

[75] Inventors: Griffith L. Resor, III, Acton; Robert A. McEachern, Wellesley; William C. Schneider, Littleton; Walter H. Worth, Carlisle, all of Mass.

[73] Assignee: MRS Technology, Inc., Chelmsford, Mass.

[21] Appl. No.: 573,400

[22] Filed: Aug. 24, 1990

Related U.S. Patent Documents

Reissue of:

[64] Patent No.: 4,769,680
Issued: Sep. 6, 1988
Appl. No.: 111,427
Filed: Oct. 22, 1987

[51] Int. Cl.[5] ..... G03B 27/52; G03B 27/70

[52] U.S. Cl. ..... 355/43; 355/46; 355/53

[58] Field of Search ..... 355/43, 46, 45, 53, 355/54; 356/401; 364/490, 559

[56] References Cited

U.S. PATENT DOCUMENTS

| | | | |
|---|---|---|---|
| 3,563,648 | 2/1971 | Baggaley et al. | 355/46 |
| 3,704,945 | 12/1972 | Denis et al. | 355/53 X |
| 3,722,996 | 3/1973 | Fox | 355/53 |
| 4,040,736 | 8/1977 | Johannsmeier | 355/43 |
| 4,452,526 | 6/1984 | Johannsmeier | 355/43 |
| 4,540,277 | 9/1985 | Mayer | 355/53 |
| 4,585,337 | 4/1986 | Phillips | 355/45 |
| 4,620,785 | 11/1986 | Suzuki et al. | 355/53 |
| 4,629,313 | 12/1986 | Tanimoto | 355/53 |
| 4,653,903 | 3/1987 | Torigoe et al. | 355/53 |
| 4,676,630 | 6/1987 | Matsushita | 355/53 |
| 4,687,322 | 8/1987 | Tanimoto | 355/55 |
| 4,696,889 | 9/1987 | Yevick | 430/311 |
| 4,702,592 | 10/1987 | Geiger et al. | 355/53 |
| 4,708,466 | 11/1987 | Isohata | 355/53 |
| 4,734,746 | 3/1988 | Ushida et al. | 355/53 |

FOREIGN PATENT DOCUMENTS

| | | |
|---|---|---|
| A59-923 | 1/1984 | Japan . |
| 60-109228A | 6/1985 | Japan . |

OTHER PUBLICATIONS

M. C. King "SPIE Symposium on Microlithography Short Course Notes: Optical Lithography" Mar. 6, 1990, International Society for Optical Engineering, pp. 192–193.

*Primary Examiner*—Richard A. Wintercorn
*Attorney, Agent, or Firm*—Haynes N. Johnson

[57] ABSTRACT

Apparatus for projecting multiple images from a pair of reticles (117) to a photo-sensitive coated substrate (1) to produce large scale electronic devices (2). A pair of parallel and proximate optical systems (29) are used, the optical systems being positioned to project in the z-direction upon a movable stage (11) subject to controlled motion (159, 169) in the x- and y-directions. The apparatus includes means (225) for determining the coordinates of motion of the stage relative to images projected from the reticles, means for using the determined positions to establish a stage transfer function for the apparatus relative to various positions of stage, and means (130) for applying the transfer function to adjust the relative positions of the reticles (117) and substrate (1) for accurate image projection, and for thereafter projecting an image upon the substrate. The stage is then stepped to a position to permit projection of an abutting image, and the transfer function is used to adjust the relative positions of the reticles (117) and substrate (1) for accurate image projection for projecting the abutting image upon the substrate (1). The steps are repeated until sufficient images have been projected upon the substrate to make up one integrated layer of a flat panel display or other large scale electronic device. After treating the photosensitive layer, subsequent layers are produced in a similar manner.

75 Claims, 19 Drawing Sheets

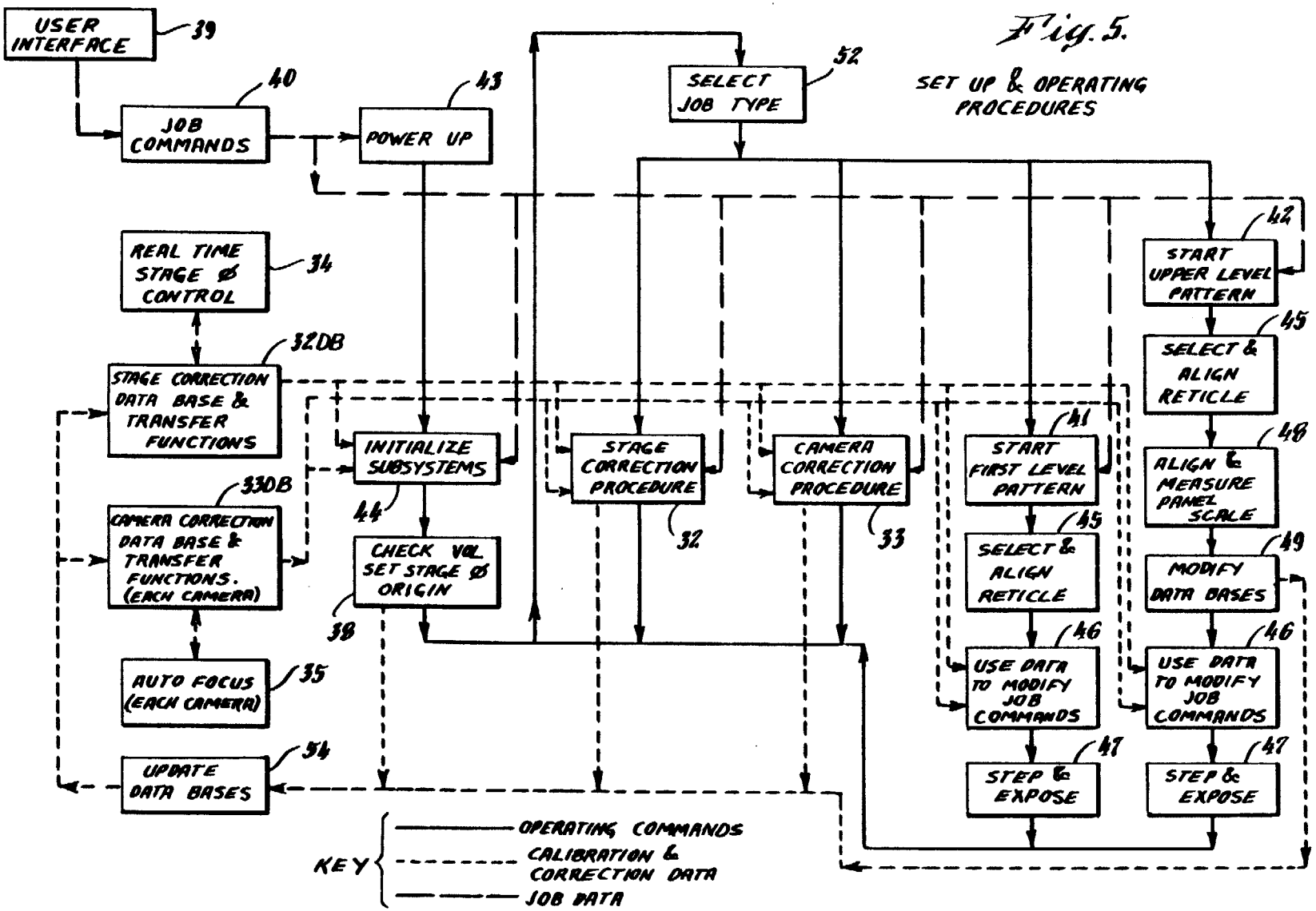
Fig. 5.
SET UP & OPERATING PROCEDURES
USER INTERFACE
39
JOB COMMANDS
40
POWER UP
43
SELECT JOB TYPE
52
REAL TIME STAGE Ø CONTROL
34
STAGE CORRECTION DATA BASE & TRANSFER FUNCTIONS
32DB
CAMERA CORRECTION DATA BASE & TRANSFER FUNCTIONS. (EACH CAMERA)
33DB
AUTO FOCUS (EACH CAMERA)
35
UPDATE DATA BASES
34
INITIALIZE SUBSYSTEMS
44
CHECK VAL SET STAGE Ø ORIGIN
38
STAGE CORRECTION PROCEDURE
32
CAMERA CORRECTION PROCEDURE
33
START FIRST LEVEL PATTERN
41
SELECT & ALIGN RETICLE
45
USE DATA TO MODIFY JOB COMMANDS
46
STEP & EXPOSE
47
START UPPER LEVEL PATTERN
42
SELECT & ALIGN RETICLE
45
ALIGN & MEASURE PARAZ SCALE
48
MODIFY DATA BASES
49
USE DATA TO MODIFY JOB COMMANDS
46
STEP & EXPOSE
47
KEY
OPERATING COMMANDS
CALIBRATION & CORRECTION DATA
JOB DATA 29
91
90
93
95
83
31
149
150
121
115
130
90
99
109
79
13
15
17
17A
17B
17C
11Y
11X
24
57
59
77
71
51
53
170
75

12X
12
57
11X
159
51
205
160
215
1
11Y
199
197
15
203
187
59
169
213
211
171
170
241
171
208
59
165
205
204
197
208
211
215
199
190
15
225
189
215
187
11Y
57

116
115
116
116
124
123
130
83
122
79
116
106
26
75
106
215
15
211
30
213
210
1
11Y

Fig. 23.
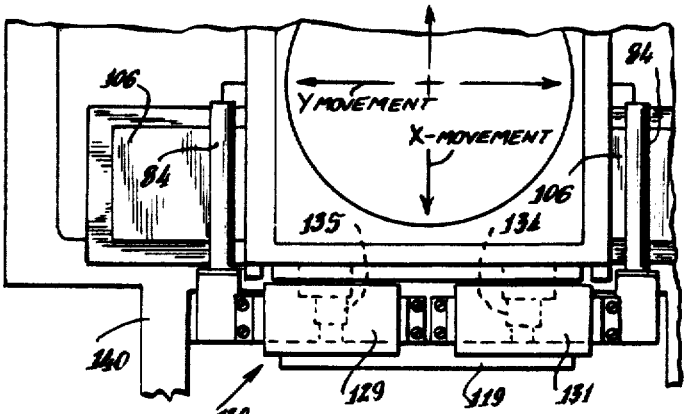
Fig. 24.
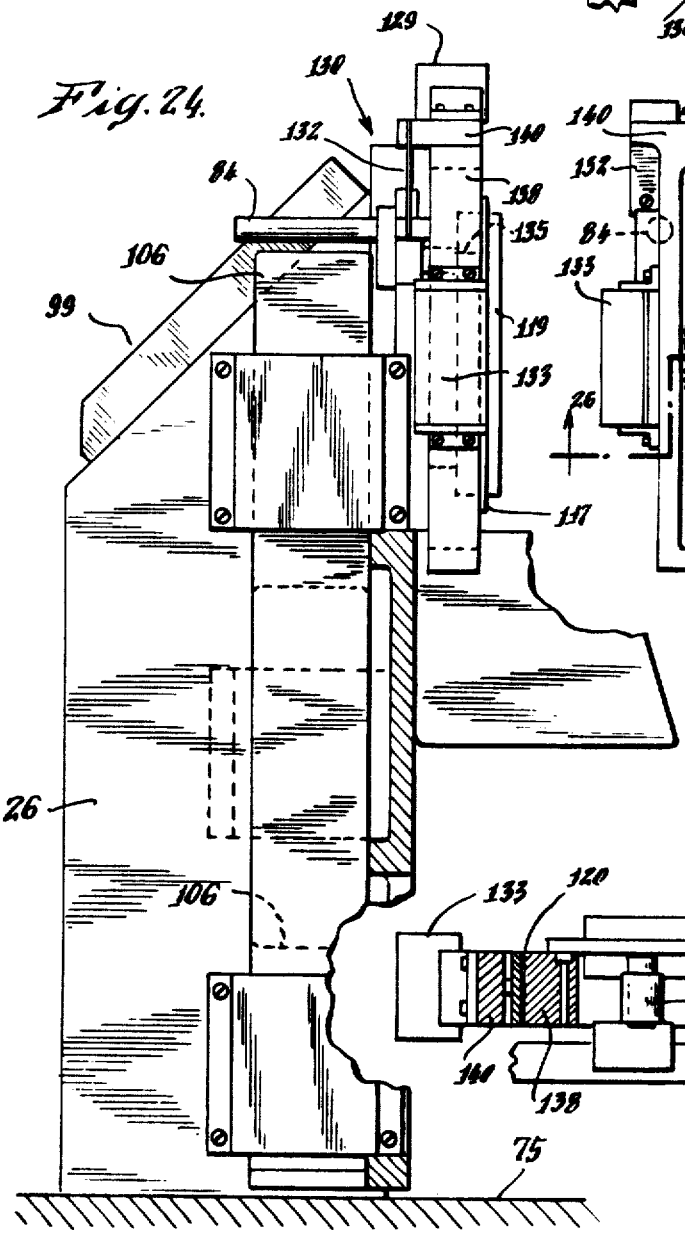
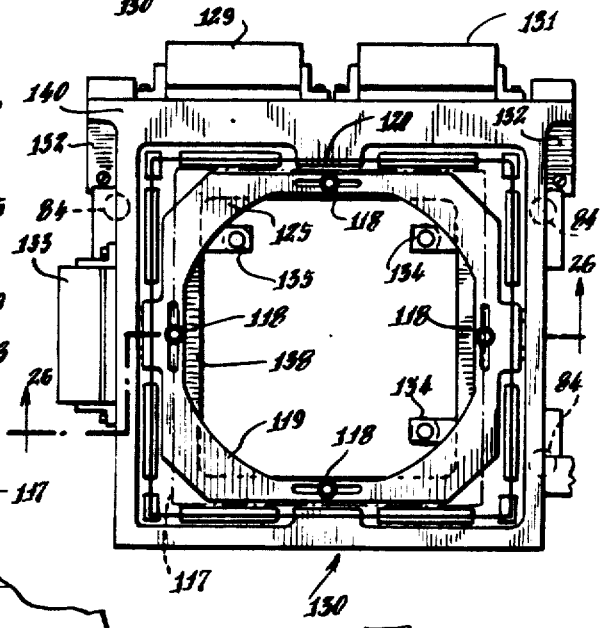
Fig. 25.
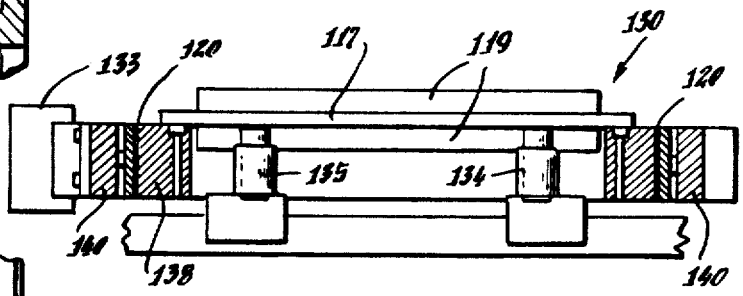
Fig. 26.

80
79
75
106
158
150
135
134
154
105
111
107
109
108
110
146
113
112
26
106
124
123
116
116₁
90
115

APPARATUS AND METHOD FOR MAKING LARGE AREA ELECTRONIC DEVICES, SUCH AS FLAT PANEL DISPLAYS AND THE LIKE, USING CORRELATED, ALIGNED DUAL OPTICAL SYSTEMS

Matter enclosed in heavy brackets [ ] appears in the original patent but forms no part of this reissue specification; matter printed in italics indicates the additions made by reissue.

*This is a reissue of U.S. Pat. No. 4,769,680.*

FIELD OF THE INVENTION

This application describes apparatus and methods for the production of large area electronic devices (LAED's), such as those required for flat panel displays (FPD's), image scanning arrays for facsimile machines or copiers, and print head arrays.

FPD's, the most commercially advanced of these applications, now measure 4.5 cm×6.0 cm, but will soon be as large as 30 cm×40 cm. They are typically 2.5 mm thick. Generally these devices are formed on a glass substrate, not on single crystal silicon. Each device contains many picture elements (pixels), often made using liquid crystal display (LCD) materials.

Each pixel is controlled by digital matrix circuitry at the edge of the device, and a thin film transistor (TFT) at each pixel. The TFT's measure about 5 micrometers (ums) in their smallest horizontal dimension. TFT's are multi-layered structures, much like IC's; and the lateral tolerance between vertically-spaced layers must be one micrometer or better. Small displays contain typically 100,000 pixels (and TFT's) in one integrated circuit; the largest devices will contain 4,000,000 TFT's.

The large area of such devices, combined with the small imaging requirements (5 um), and tight tolerance between layers create difficult lithography problems that can best be solved with "stepping-aligner" technology.

This invention is related to wafer stepping, a technique used to make IC's. However, a scaled up wafer stepper will not provide the speed, tolerance, or low production cost required for these large area devices. Performance gains of 5 to 10× over current practice are required.

The intended applications differ from wafer stepping applications in that (a) images must be printed in a controlled manner on unstable, amorphous substrate materials, often transparent glass, (b) there are no "scribe lines" between images; the entire array of images must be oriented and dimensioned to abut, so that the composed array of images functions as one single large area electronic device, (c) the array must be composed of multiple image patterns per layer; up to 9 separate images may be required on one layer (IC's typically use only one pattern per layer), (d) the resulting product is viewed directly by people; therefore, image quality and abutting must meet difficult perception tolerances not relevant in IC manufacture.

The above issues require new approaches in machine design, machine control, set up methods, and operating methods, all as will be disclosed in this document.

BACKGROUND OF THE INVENTION

The apparatus and methods of this invention are directed to the rapid creation of precisely aligned layers over large areas of high resolution photoresist images on amorphous substrates, often transparent glass substrates. Significant speed, cost, and alignment tolerance improvements are provided for fabrication of LAED's.

The large size of substrates used to make LAED's (compared to wafer substrates used in IC manufacture) allows one to use two coordinated optical columns, i.e., camera and lens systems, to print the pattern. These two columns, when properly aligned, each print roughly half of an LAED, substantially doubling printing speed over conventional single column steppers since two lenses working simultaneously print twice the area at a time.

When stepping aligners are used to generate arrays of IC patterns, the patterns are later cut into individual chips. The space left during patterning for later cutting, the "scribe line," is often used for local alignment. The stepper disclosed in U.S. Pat. No. 4,040,736, Johannsmier et al., describes such an alignment system. This approach relieves the performance burden placed on stage stepping accuracy, by allowing continuous realignment of the stepping pattern within the array.

The manufacture of LAED's, such as flat panel displays, is substantially different. All of the individual images must abut to tight horizontal tolerances to form an overall integrated, uniform, and precisely interconnected, correlated circuit pattern, with no perceivable joints. Due to the absence of spacing between images, one normally cannot use an alignment mark between images each time the stage is stepped. Rather, one set of alignment marks for the entire array, placed around the outside edge, is used. As a result, an order of magnitude improvement in stage metrology is needed to maintain vertical alignment tolerances. The apparatus of this invention includes special sensor subsystems, appropriate system control software, and machine setup methods to accomplish this improvement.

The behavior of potentially unstable amorphous substrates must also be corrected for in the apparatus, to achieve proper coordination of the optical columns (cameras) when printing later levels of the LAED pattern. After one level of patterning, the partially completed circuit (on the substrate) will be cycled through a thin film process, usually involving a significant temperature cycle. After such a process, the substrate and circuit pattern will likely change in overall size. This "scale" change is measured and compensated for in the system control software, using correcting mechanisms provided in the apparatus.

Historically, the integrated circuit mask-making industry did at one time use multi-barreled repeaters, that is, units with banks of six or nine lenses. For example, Baggaley U.S. Pat. No. 3,563,648 discloses the use of nine parallel optical columns directing images to nine separate masks. The use of multi-barreled repeaters was unsuccessful, however, and the practice ceased about 1974. The problem had been that stage travel was measured in one place and the lens barrels were in another, so inaccuracy resulted. This is because there is a radial component of stage motion (yaw) which causes misalignment. This arises because motion of a stage is not in an exact straight line, but can be off over a short distance by as much as two arc seconds. This could create an error in the projected image of as much as 1.6 um. Since, in making flat panel displays, we are dealing in error factors as low as 0.2 um, an error factor of as much as 1.6 um is unacceptable.

Early steppers such as that made by Baggaley et al. were also fixed focus cameras. The lenses used in these tools were non-telecentric. The magnification of the projected images varied by as much as 3.0 um, due to stage and plate motion up and down under the fixed focus columns. In the apparatus of our invention, asymmetrical telecentric lenses are used, and individual focus control and motion is provided for each optical column to overcome these problems.

Finally, the stepper built by Baggaley, et al., imaged a separate plate for each column. The relationship among the columns (cameras) was therefore not important; the images from the several columns were never integrated into one contiguous image on one plate. The apparatus of our invention must successfully project images in exact spacing, shape, size, and orientation onto one plate, so that an integrated large area electronic device is created from precisely joined images. A method for precisely setting and maintaining the absolute column magnification and spacing must be provided.

It should be noted, also, that Baggaley had no way of repositioning a substrate and no method of adjusting optical columns relative to one another.

Another example of multiple optical columns will be found in Fox U.S. Pat. No. 3,722,996, which discloses the use of dual optical columns. These, however, were not used together; rather, one was for a pattern generating mode and the other for a photorepeater mode. In reality, this was simply two separate machines combined together for economy; and the two units were never used in parallel.

Interferometer systems for controlling stage positioning are described in Baggaley U.S. Pat. No. 3,563,648 and Fox U.S. Pat. No. 3,772,996. In these patents the use of two interferometers on one machine is described, one for each axis.

The use of multiple alignment or reference marks on a wafer, at least one for each chip being etched, will be found in Van Peski et al. U.S. Pat. No. 4,521,114; Meshman et al. U.S. Pat. No. 4,550,374; Suzuki et al. U.S. Pat. No. 4,620,785; Phillips U.S. Pat. No. 4,585,337; and Tanimoto U.S. Pat. No. 4,629,313.

BRIEF SUMMARY OF THE INVENTION

We utilize a pair of parallel and proximate optical columns (camera systems) to simultaneously project two images upon a single glass substrate. Due to physical limitations, the images from the two columns do not abut in a given projection; but images from a given optical column abut when the stage is stepped, and, after several steppings, the sets of images from the two columns abut to form a continuum of images in both x- and y-directions. This precise butting of images requires a type of alignment control not found in the usual wafer stepper. The images from the two cameras must not only be properly positioned, but must also be of precisely the same size, shape, and orientation, so that they can properly abut to form a large, uniform, integrated image.

While simple in concept, the use of multiple optical columns is in fact complex. Many functions normally assigned to stage mechanisms, such as focus motion, must be assigned to the individual columns. Each camera must utilize a special, asymmetrical lens. This lens prevents magnification changes on the substrate (image) side of the lens when slight defocus occurs (due to substrate unflatness), but enables magnification adjustment on the opposite (object) side of the lens.

A special six degree of freedom chuck holds the reticle (master object). Motion of this chuck provides for adjustment of magnification, trapezoid error, X, Y position, and rotation of the projected image. The X adjustment also provides for the precise setting of the distance between the two cameras' images.

Laser interferometer metering of the X and Y stages is used and is referenced to the optical axis of both columns. This enables proper placement of the stage under each optical axis. Stage yaw errors are measured with an extra laser interferometer, and stage yaw is corrected using a special yaw motion built into the Y stage and appropriate control software. In this manner, the substrate is simultaneously positioned in the proper position under the second camera. By correcting for stage yaw in the stage mechanism, the possibility of adding additional columns in the future is simplified.

An in-stage calibration subsystem is used to establish and maintain the proper correlation between each camera's projected images and the X, Y motion. System control software and set-up methods provide proper control of system operations.

As the stage is stepped, array of images from each of the two lens systems are precisely butted with one another. After a predetermined number of steps, the images from the two lens systems also abut, or almost abut, forming the first layer of a full-size, precise flat panel display. If the display array size is not an exact multiple of the largest image size that fits through a lens, then a separate, smaller circuit pattern, equal to the remainder distance, can be used to fill the intermediate space. In normal practice it is often easier to make the image size slightly smaller, equal to the next larger integer division of the array size, and step an extra row of images of the same size. Using this method, the column spacing can be fixed, precisely adjusted, yet be unequal to an exact division of the panel size, and still provide significant throughput improvement.

Each camera also includes a fast, wheel-like reticle changing capability, so that multiple patterns can be printed on one substrate with minimum loss of throughput. For the smaller patterns printed at the edge of an LAED pattern, a variable, rectangular field stop assembly (masking system) is provided. This system allows users to place multiple patterns on one reticle, but print only one pattern at a time. The offset of each such pattern from the optical axis is supplied by the user and compensated for in the control software. The round wheel-like changer mechanism carries four reticles, and automatically changes reticles. An in-column alignment system quickly positions each reticle after it is interchanged. A high-powered mercury arc lamp illuminator provides exposure energy. The exposure on each illuminator is controlled by feedback from an intensity sensor on each lamp. In this manner the exposure energy of each camera can be matched and still provide the proper exposure dose, even though the optical efficiency of each camera may differ. Finally, each camera can be moved up and down on a rigid Z axis, nominally orthogonal to the X, Y plane. This motion provides precise adjustment of focus for each camera, even though the substrate may be at slightly different heights under each camera, due to plate unflatness or stage top runout.

X and Y laser interferometers reference the right-hand lens column (the lower part of the right-hand camera) to the stage. These two interferometers provide positioning data which is used by the system control computer and software to precisely locate the stage under the right-hand camera. A second Y-axis interferometer is provided to measure the horizontal translation error caused by stage yaw. A third Y-axis interferometer is provided to maintain yaw control but allows the use of a much shorter stage mirror during some modes of operation.

Two types of alignment systems are provided on the system. To take advantage of the transparency of many proposed LAED substrates, a transmission alignment system is included in the X, Y stage, below the substrate. For opaque substrates or thin films, a reflective alignment system is mounted on the right-hand lens column above the substrate.

Calibration data gathered defines a first transfer function for the first level exposure. When the substrate is reloaded on the system, an alignment system, either transmission alignment system or reflective alignment system, determines the X, Y location of the substrate, as loaded onto the X, Y stage. The rotation of the substrate, and its X, Y scale, are also determined; and the orthogonality between the X and Y axes is measured. This new data is used to modify the calibration database of the machine, creating a second transfer function for the second layer, and so on. In this way the apparatus is realigned with the substrate pattern, even when it is placed incorrectly onto the stage, or its amorphous nature has allowed a scale change in either X or Y direction, or both.

Similarly, if two machines are involved, one patterning the first layer, and the second being used to pattern the second layer, the small differences between machines is automatically corrected for by using this six degree of freedom alignment method. (The six degrees of freedom for alignment are X-, Y-, plate rotation, X scale, Y scale, and the orthogonality of the X- and Y-axes).

Though this application discloses the use of two optical cameras, our apparatus may use additional cameras to provide higher throughput on larger substrates. Our system can also be used to create multiple separate circuits upon a single substrate as long as the alignment is set.

DESCRIPTION OF THE DRAWINGS

FIG. 5 is a flow chart explaining the methods for exposing substrates and for handling error calibration.

FIG. 23 is a partial top plan view of the camera.

FIG. 24 is a rear elevation of the left-hand camera.

FIG. 25 is a side elevation of the camera showing the reticle alignment chuck.

FIG. 26 is a section taken on line 26—26 of FIG. 25 showing the reticle on the chuck.

DETAILED DESCRIPTION OF THE INVENTION

1. The Flat Panel Display

The preparation of a flat panel display 2 ("FPD") involves a new dimension in microlithography. The finished product is not a mask, made by repeated printing of the image on a reticle, for a mask is not multi-layered. It is not simply a multi-layered chip, one of a series made on a single wafer, for it is many times the size of a chip, for example, 25 cm on a side. It may be thought of as one large integrated circuit that must be built in parts, in which the parts are created in at least two places on the same substrate simultaneously and must be properly oriented and sized to accurately abut in the completed image. Simultaneous imaging is necessary to provide enhanced throughput time.

Figure 1:
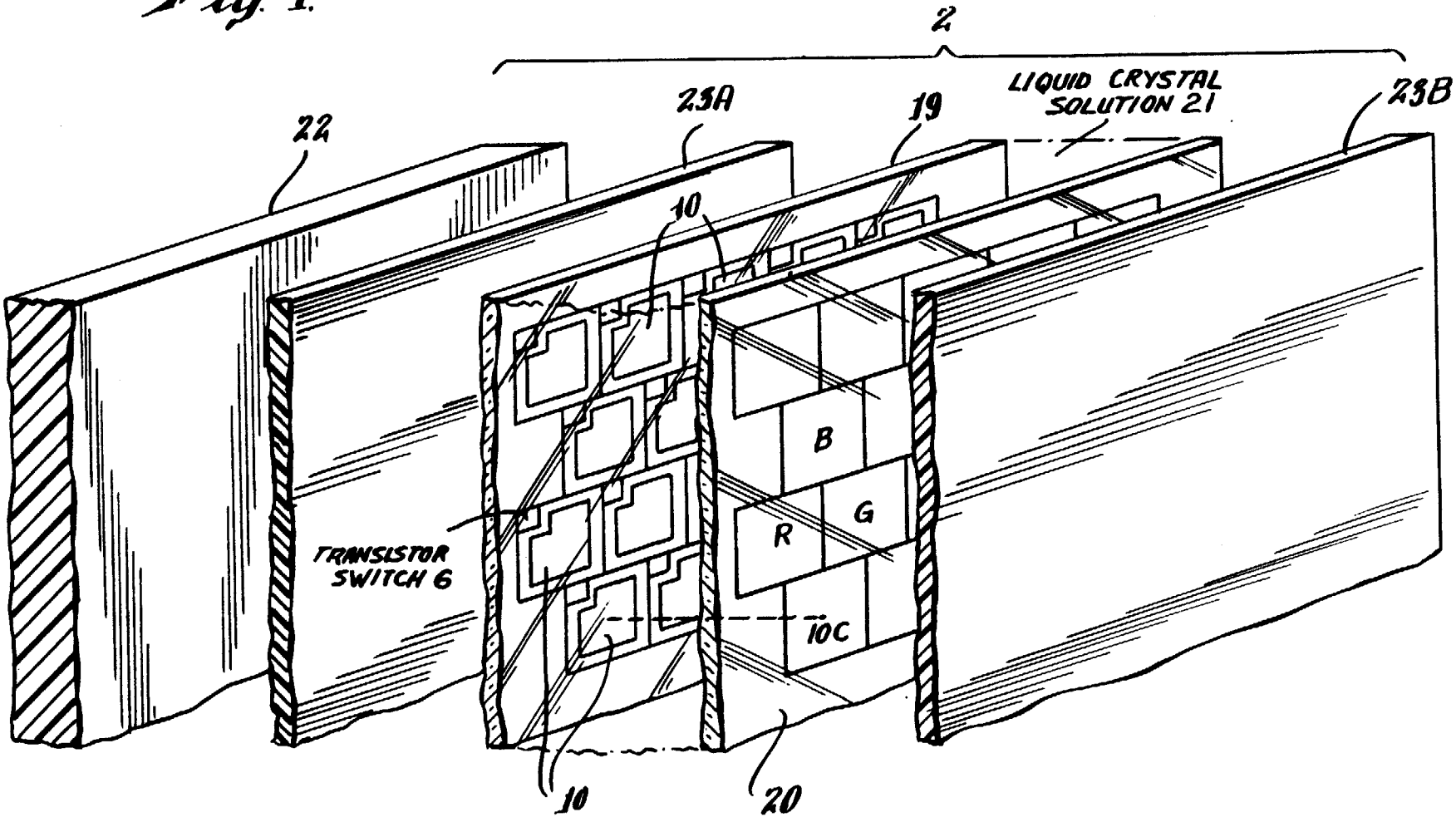
FIG. 1 is an exploded view of a portion of a flat panel display.

FIG. 1 is an exploded view of a portion of a flat panel display ("FPD"), in this instance a liquid crystal display ("LCD"). It includes five functional layers. The first is a white light source 22. Next is a first polarizing filter 23A, which is usually mounted as a thin film directly on the next component, the circuit plate 19. The circuit plate provides electronic control over many small areas, called pixels 10 (see FIGS. 2A and 2B), across the area of the display. The next element is the color filter plate 20 which carries the three primary colors, also organized into pixels 10C. The back surface of plate 20 is coated with indium tin oxide ("ITO") to act as a ground plate. For each pixel 10C on the color filter plate there is a corresponding pixel 10 on the circuit plate 19. This arrangement allows each pixel on the circuit plate to control one pixel on the color filter plate. The last component is another polarizing light filter 23B, rotated 90° with respect to the first polarizing filter 23A.

The sandwich of components described above controls the transmission of light through the display as follows: The volume between plates 19 and 20 is filled with liquid crystal material 21. This material has the unusual property that it will rotate the polarization of light when an electric field is applied across it between pixel 10 and the ground plate. When a pixel 10 is not electrically energized, the two polarizing filters cause light coming through that part of the display to be blocked. When a pixel is energized, the liquid crystal material 21 at that pixel site rotates the polarized light so that it can pass through the second polarizing filter. In this manner individual pixels of the display are turned on.

The color of the pixel depends upon the color of its companion pixel on the color filter plate. Colors other than the three primary colors are achieved by "blending" portions of the primary colors. This blending of colors requires that the control of each pixel be proportional, not just on-off, so that various percentages of each primary color can be selected. This property is called "grey scale".

In order to achieve a high resolution color picture each pixel 10 must be small. Many pixels are then used to provide a large area display. For example, one existing LCD display measures about 5.4 cm by 4.6 cm, for a total area of about 24.8 cm. This display uses 90,000 pixels, or about 3630 pixels per square centimeter.

Figure 2A:
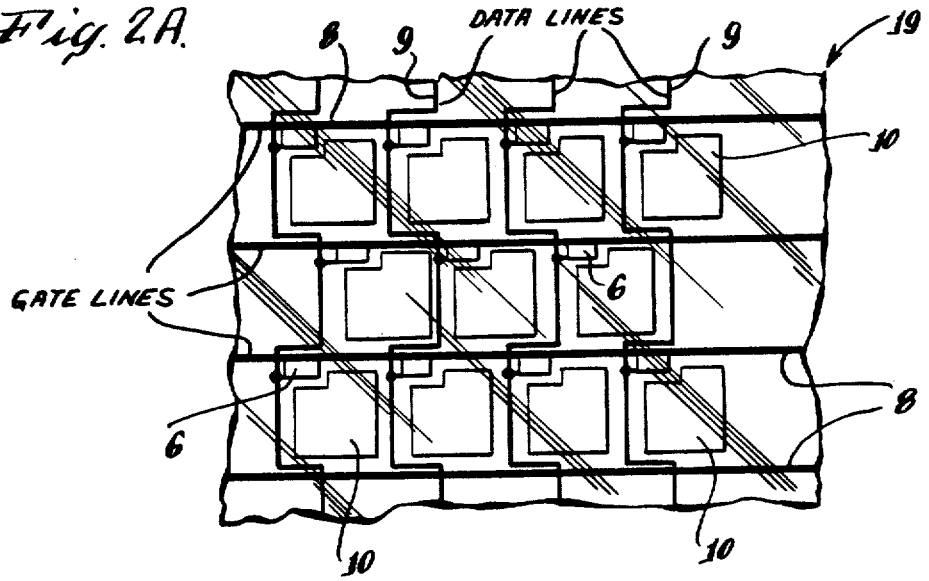
FIG. 2A is an enlarged plan view of a portion of the display of FIG. 1.
Figure 2B:
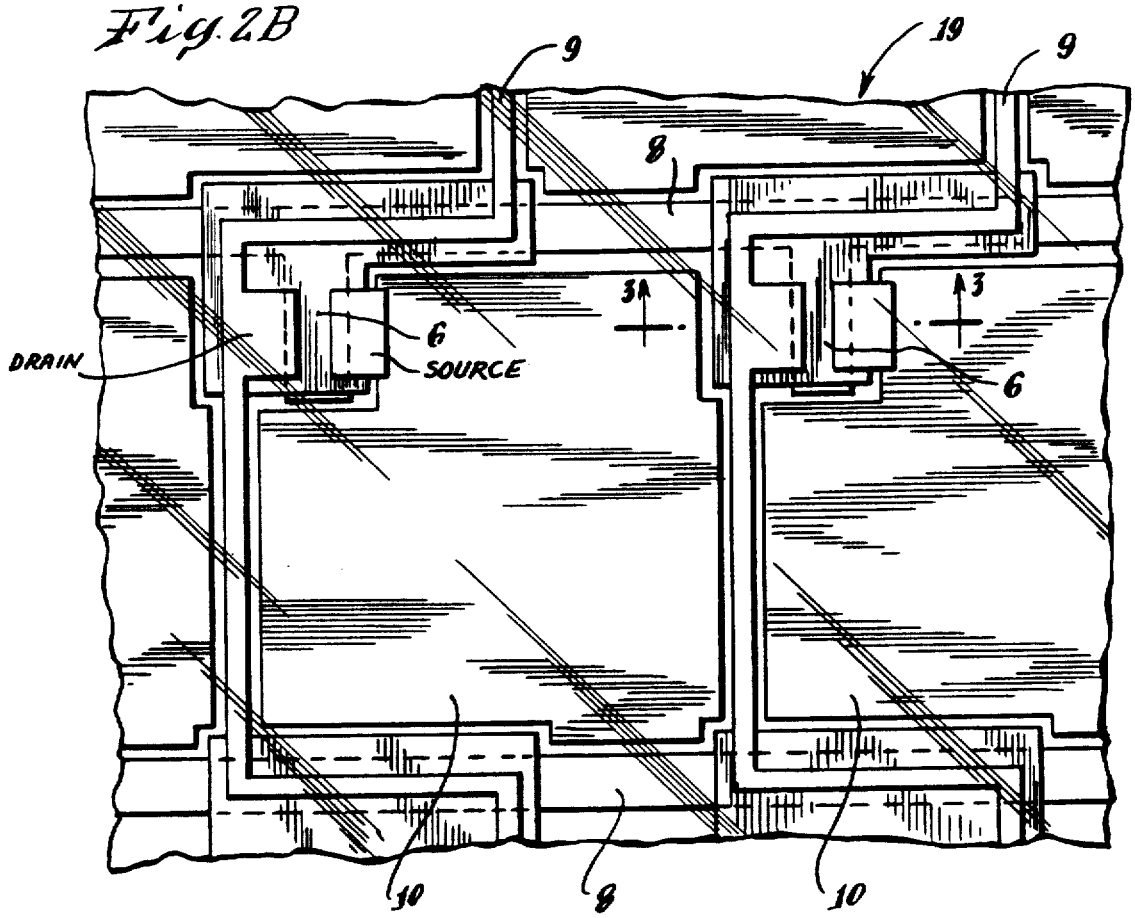
FIG. 2B is a further enlargement of a portion of FIG. 2A.

The best LCD displays have a control element at each pixel 10 on the circuit plate. A transistor is placed in the corner of each pixel. FIGS. 2A and 2B show enlarged views of a pixel on the circuit plate 19. When the horizontal gate line 8 is energized (typically, to 20 volts), the gates of all transistors 6 in that row are ready to conduct electricity. Some of the vertical data lines 9 are energized (typically, to 10 volts), and some data lines are left unenergized. The energized data lines cause the transistors 6 at the data and gate line intersections to conduct electrons onto that pixel, turning that pixel on. In normal practice, another row of the display is written periodically.

During the time that the other rows of the display are being written the transistors 6 on the inactive rows block the flow of electrons to or from the pixel. This holds the information pattern on each row until it is rewritten on the next scan. The nearly constant presence of charge at the "on" pixels gives excellent control of the liquid crystals at those points, resulting in good viewing angle and contrast. The transistor at each pixel serves to enhance the quality of the displays.

Since the pixels 10 must be invisible to the eye, the transistors 6 in their corners must be even smaller. Electrical properties also mandate small dimensions for the transistors.

Figure 3:
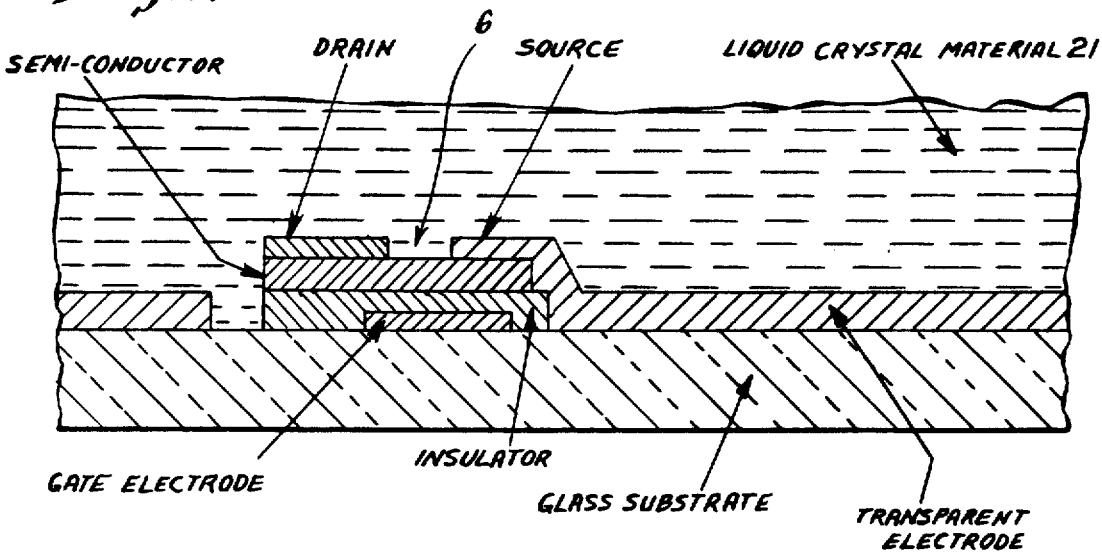
FIG. 3 is a section of the thin film transistor, taken on line 3—3 of FIG. 2B.

The transistors are typically made from thin films of amorphous silicon materials, on glass, as shown in FIG. 3. To get acceptable switching speeds from such "low grade" semiconductor materials, small gate lengths must be used, typically they are about 5.0 ums. The lateral relationships between vertically spaced image layers is important to circuit tolerances; and usually at least 1.0 um lateral alignment must be achieved. In short, the fabrication of transistors for active matrix displays requires manufacturers to achieve integrated circuit tolerances over the area of a full layer and also between layers.

Older techniques such as contact printing cannot achieve the desired tolerances over these large areas. Projection techniques are required. Projection aligners can provide the yield and patterning required, but no existing projection system can cover the area of a large display; at best, a 10 to 15 cm area can be printed in one exposure.

As can be seen, the production of an FPD requires a higher degree of error control than has been previously obtained. The error control must reduce the errors to far below those tolerated on a lesser-sized product, because repeating the pattern adds an error source and because of the need for butting adjacent image fields.

2. Composing Image Arrays Using Two Cameras

Figure 6:
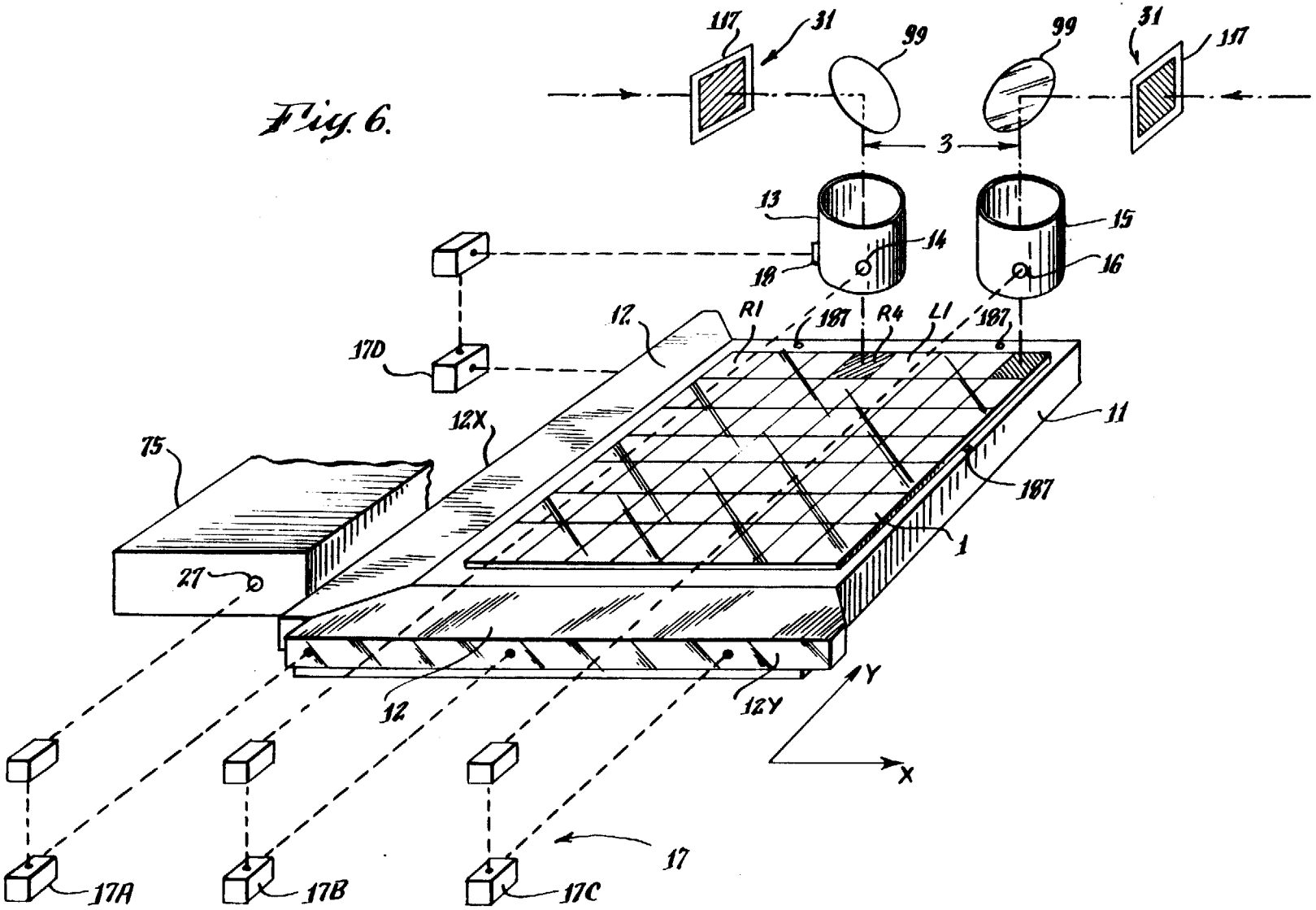
FIG. 6 is a rear perspective schematic view showing the optical controls used for aligning the two optical columns with a substrate for producing image patterns such as are shown in FIG. 4.

FIG. 6 shows schematically the use of two lens systems 13 and 15 to generate one integrated image on substrate 1, as used in the circuit plate 19 of an active matrix liquid crystal display (AM/LCD). Note that the limits of projection lens design prevent spacing the two cameras close enough to be able to produce immediately butting images. Instead, the images from each camera abut first to other images produced by that same camera. (For example, R1 abuts R2, until after several steps of the stage, the array R1, R2, R3, R4 produced by the first lens system 13 will abut the array of images L1, L2, L3, and L4 produced by the second camera, where "R" and "L" represent images from the right and left cameras, respectively). Roughly speaking, each camera then produces one-half of a circuit plate's pattern, with the inter-camera joint occurring between $R_4$ and $L_1$, as shown in FIG. 4.

At first, it may seem that for every pattern size the inter-camera spacing must be adjusted so that the arrays made with each camera will also join in the middle to make a display of the desired size. This is impractical, since each camera is large, heavy, and too many precision adjustments would have to be made every time the display size changed.

Figure 4:
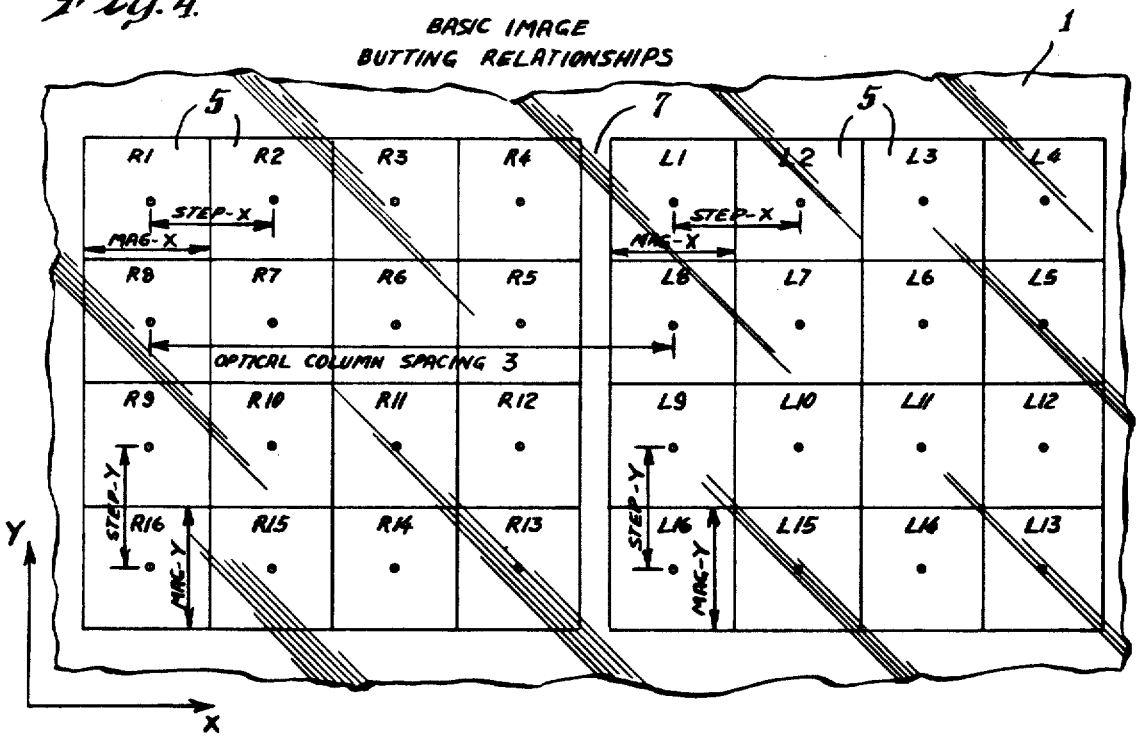
FIG. 4 is a plan view of the image layout (viewed from the back of the apparatus as in FIG. 6) required to project abutting images upon a substrate using dual optical columns.

An alternative method is to use one camera to step a special reticle image into the remainder space 7, a "remainder image." (See FIG. 4). This remainder image may be designed by the user to exactly fill space 7 a row at a time or may overlap the already projected arrays from each camera, taking advantage of the repetitive nature of the patterns. However, a higher throughput method is to produce reticle artwork for each camera's array that is smaller than the maximum allowed by the lens field of each camera, but is an integer subdivision of the inter-camera spacing. For example, in FIG. 4, if we assume that the optical columns have a minimum spacing 3 (FIG. 6) of 165 mm. and that the pixel images 5 ($R_1$, $R_2$, $R_3$, and $R_4$ for the right-hand column; and $L_1$, $L_2$, $L_3$, and $L_4$ for the left-hand column) are 35 mm. long in the stepping direction, then four images 5 will be required from each column to fill the space as the stage is stepped in the x-direction, and there will be a remainder space 7 of 25 mm. (165 mm.−[4×35 mm.]=25 mm.).

This remainder space 7 could be filled with a separate 25 mm image, and, here, a fifth stage step for each horizontal row. However, this would require a change of reticle 117, taking approximately 10 seconds. By making each reticle image 33 mm in the X-direction, exactly five steps in X will complete both arrays and the whole pattern, without any added stage steps, and avoiding the reticle change. By using either method, the apparent need for infinitely adjustable inter-column spacing can be avoided without decreasing throughput, but greatly simplifying machine design, setup, and operation.

After the first horizontal row has been imaged, the stage steps in Y by an amount that is precisely matched to the Y-dimension of image 5, and a new row of X images is projected as before, but stepping in the reverse X direction, to avoid the time needed to return to the opposite end of travel. As can be seen, it is critical that the sizes, shapes, position, and rotation of the projected images 5 be correlated. Not only must the images from the right-hand lens 13, namely R1, R2, R3, etc., join correctly with each other (and the same with the left images), but the farthest right lens image, R4, must properly join with the nearest left lens image, L1. This requires very accurate setup and maintenance of the length relationships among the several coordinate systems. Alternatively, each single X-direction step can be followed by projection of all images in the Y-direction, followed by the next X-step.

3. System Overview

FIGS. 7–10 and 17 show the stage and the dual optical systems of our imaging system. Light for exposure is provided by illuminators 90. This light passes through field stop assembly 121, through the reticle 117, reflects off folding mirror 99, and passes through the main projection lens 13 or 15 to the substrate 1. The main projection lens 13 (or 15) images the pattern on reticle 117 onto the substrate 1. Use of the folding mirror 99 in the illumination system permits the two lenses to be placed closer to one another than would be the case if the mirrors were absent, since the diameter of the condensing lenses 95 is greater than the diameter of lenses 13 and 15.

The asymmetric telecentric design of main projection lens 13 (or 15), the autofocus sensor 213 (FIG. 17), and Z axis drive 105 maintain precise control of focus of the projected image, even when the surface of substrate moves up and down slightly due to material tolerances or stage motion. The optical systems 29 rest on a large (1,000 kg) granite bridge structure 75, mounted on legs 77, which in turn are mounted on the large (3,000 kg) granite base 51. This structure provides the rigid, stable platform required for such a large and precise stepping and imaging system. Base 51 rests on commercial vibration isolation mounts 53.

Reticle 117 is held on a six degree of freedom reticle chuck alignment chuck 130. (By "six degree of freedom" we mean motion in x-, y-, and z- directions and rotation about $\phi_x$, $\phi_y$, and $\phi_z$ axes). This chuck's motions permit controlled, programmable motion of reticles as needed to correct magnification, trapezoid error, X, Y, rotation, and inter-image spacing. Since the main projection lenses 13 and 15 are asymmetrical, adjustment of magnification and trapezoid error can be made by varying the lens to reticle distance using actuators 84 and, of focus, by varying the lens to substrate distance. Adjustment of chuck 130 also serves to correlate image spacing and rotation; for example, rotation can be used to align images to compensate for rotation of the substrate.

Substrates are placed on stage 11Y by a commercial automatic substrate handling system (not shown). As shown in FIGS. 7, 9, 11, 12, and 17, stage 11Y is partly mounted upon the X stage 11X, and partly references the main surface of the base 51. This arrangement makes for a more compact machine design than the usual design, and provides for easier maintenance, as the Y stage can be easily removed to the rear. The X stage provides the Y axis guide 165, and drives the two stages in X. Both stages use commercial, frictionless linear motors 159 and 169 to step the stages across desired distances.

Figure 11:
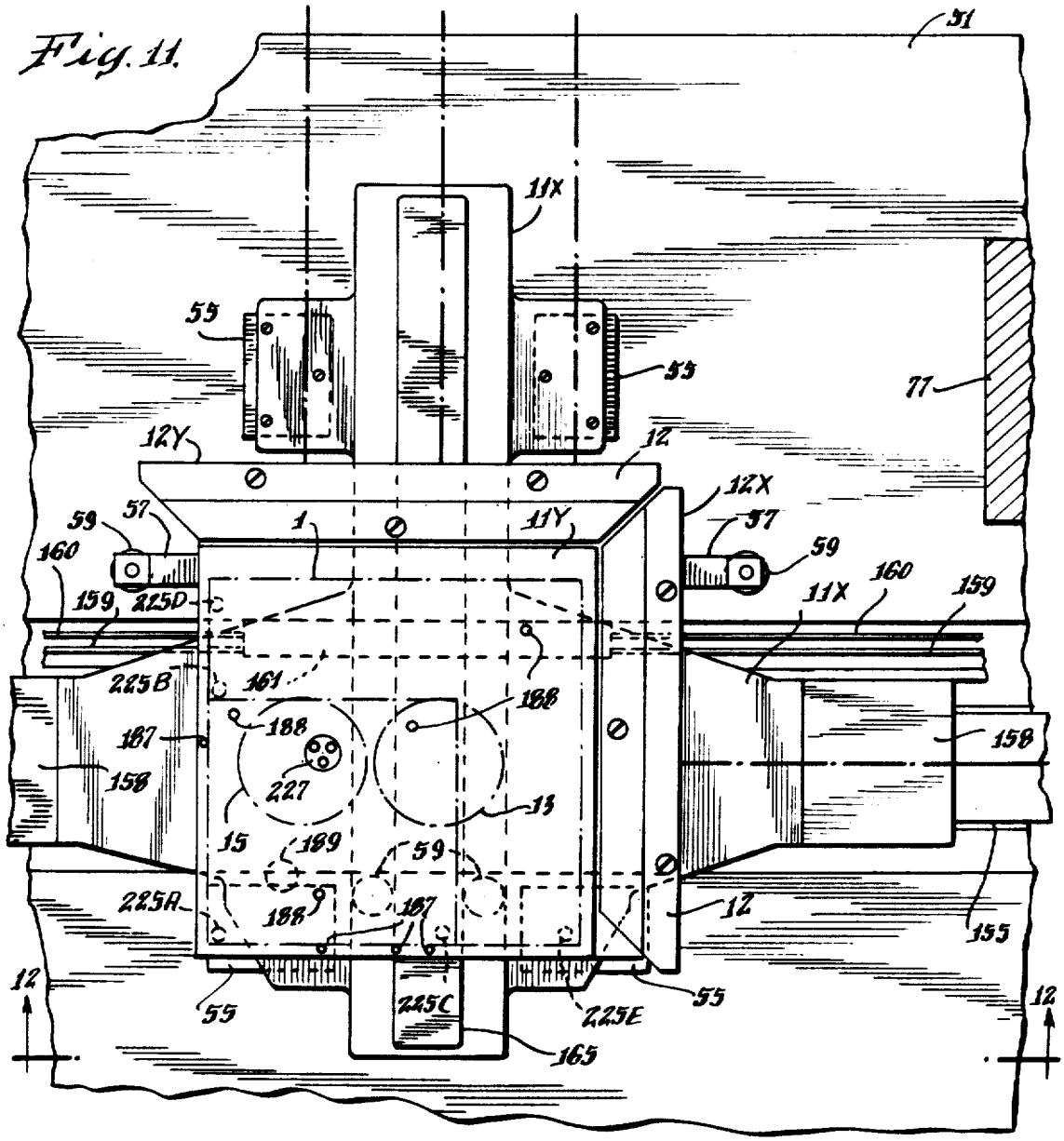
FIG. 11 is a plan view of the stage for carrying the substrate and showing the means for moving the stage in x and y directions.

The Y stage, shown in plan view in FIG. 11, contains a banking chuck 189 and vacuum line 190 for drawing substrate 1 against banking pins 187. In this manner, substrates are preâligned on the stages. Provision has been made for substrates as small as 300 mm and as large as 450 mm, square or rectangular.

The in-stage calibration unit 227 is located under the Y stage, as shown in FIG. 11. This unit is normally kept just below the substrate chucking surface of stage 11Y, but is raised to the image plane 30 when used for calibration of projected images.

The yaw adjustment mechanism 200 is mounted to the stage 11Y as well. Bearings 57 provide the lift support of stage 11Y; Y guide bearings 203 and Y guide surface 204 provide guide control for stage 11Y. Transmission alignment system units 225A, B, C, D, and E, described below, are placed in the stage, under the edge of substrate 1, where they can be used for transmission alignment of transparent substrates, directly referencing substrate 1, when partly processed, to reticles 117L and 117R.

Stage positioning is controlled by laser interferometers 17A–17D (FIGS. 6–10). Our system uses four interferometers for stage control, one, 17D, for X position, and three in Y, which is not typical. Interferometer 17B controls the position of the stage in Y, with reference to reflector 14, mounted on the right hand lens 13, and stage mirror 12Y. Interferometer 17C measures the Y translation error under left-hand lens 15 (with reference to reflector 16) caused by stage yaw and, together with the yaw correction mechanism 200, controls stage yaw errors. Interferometer 17A is used when the stage travels to its full right position, instead of interferometer 17A, so that stage mirror 12Y can be made shorter and yet provide the full travel in X with active yaw control. Stage mirror 12X provides for X position referencing and works in conjunction with interferometer 17D and reflector 18 on lens 13. Both stage mirrors are mounted on stage 11Y and are rigidly connected to substrate 1 during stepping to provide the best possible measurement of the position of substrate 1. (Normally a rotation mechanism for aligning the substrate to the mirrors would be included on top of stage 11Y. However, such rotation mechanisms contribute significantly to measurement errors and decrease stepping speed, so are to be avoided. The novel yaw control 200 of this system can be used, as well as chucks 130, to circumvent this problem).

To provide the needed long-term stability, the entire system is placed in a temperature and particle controlled environmental enclosure (not shown). A computer and associated electronics control the system and are housed in separate electronic racks (not shown) outside the environmental enclosure.

4. The Dual Optical Systems

Figure 7:
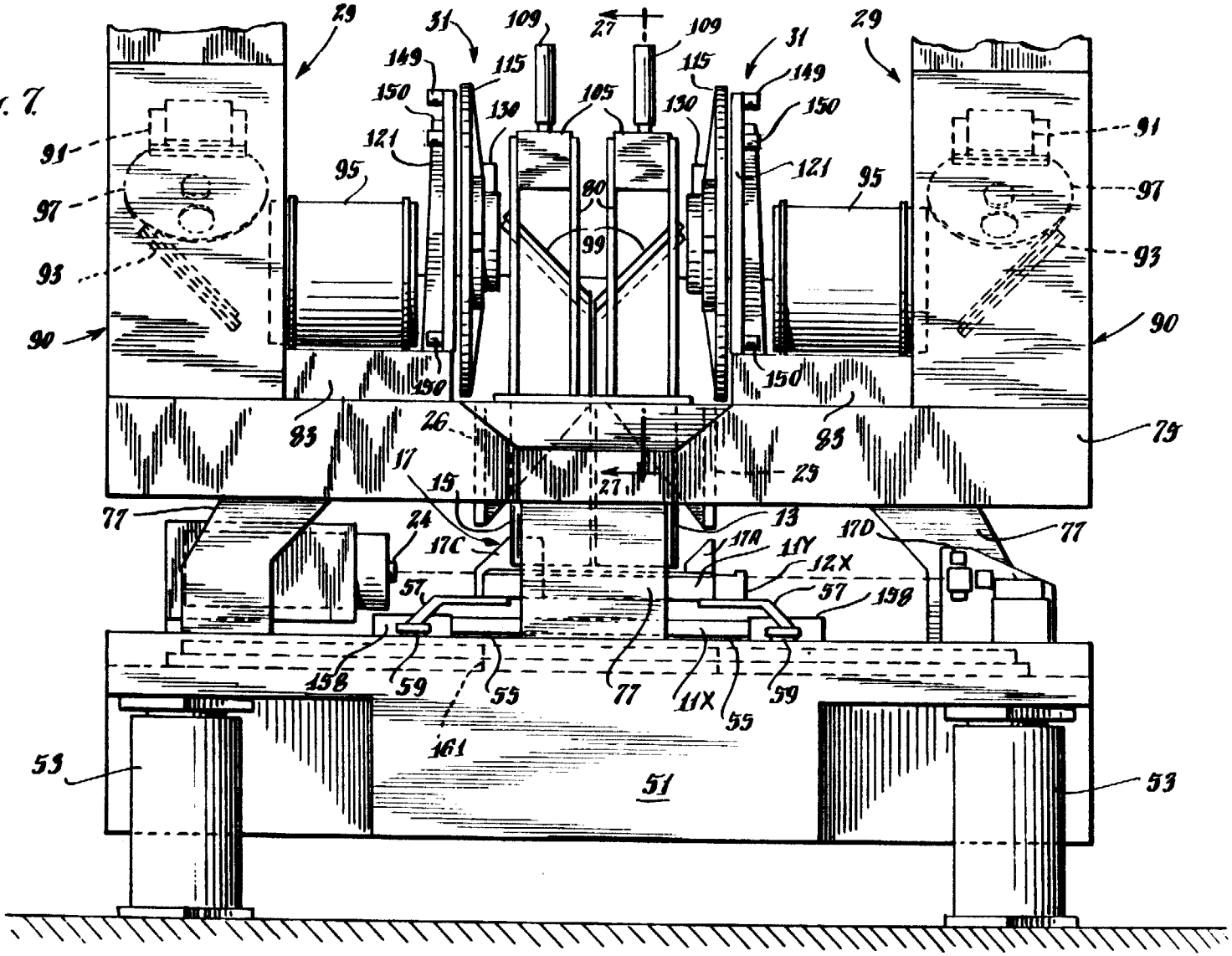
FIG. 7 is a front elevation of our imaging system showing the stage and the dual optical columns.
Figure 8:
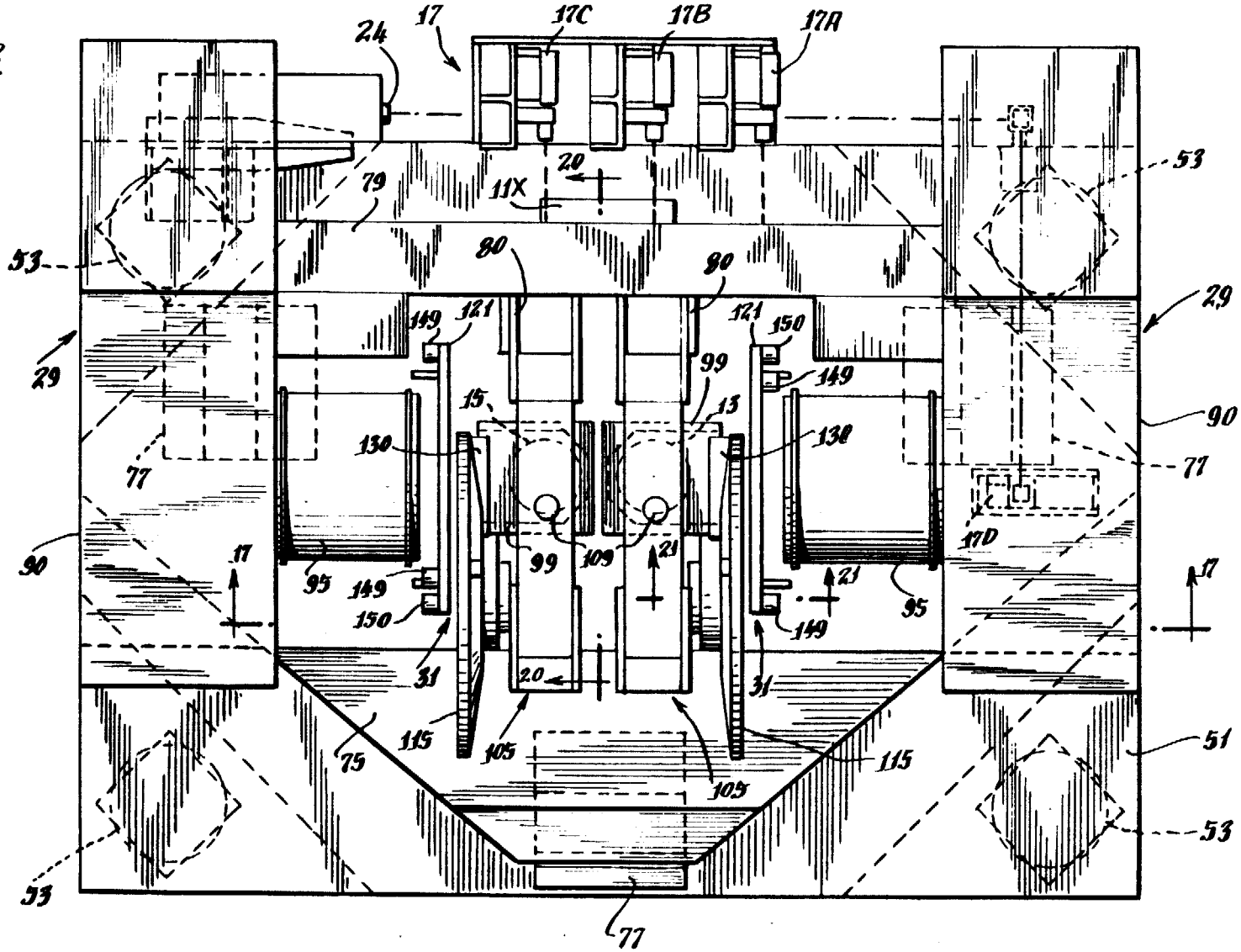
FIG. 8 is top plan view of the imaging system.

As shown in FIG. 7, the dual optical systems 29 are mounted on granite bridge 75, above the motions of the machine. One optical system is the approximate mirror image of the other, with the exception of mirror 18 and the reflective alignment system 241 which are mounted only on the right-handed camera, on lens 13. The detailed description will therefore only be given for one camera but should be understood to apply to both. Subassemblies will be taken in their order of appearance, proceeding up from substrate 1.

Each camera contains a main projection lens 13 or 15 (FIGS. 6, 7, 10, 17, and 20). This lens is asymmetrical, being telecentric to within 1° on the image (substrate) side and non-telecentric by 10° on the object (reticle) side. These values describe the approximate angle of a ray at the edge of the image and object, respectively, where 0° represents a ray that is exactly perpendicular to the image or object planes. The tangent of these angles properly predicts image size change with motion along the optical axis. (The tangent of 1° is 0.017). When slight defocussing occurs (10 ums typically, due to adjustment errors, plate unflatness, or stage top runout) images retain their desired size to within acceptable limits. In this manner magnification stability is achieved, even on inexpensive production substrates. On the object side, the 10° of non-telecentricity equates to 1 um of magnification change across the image field diameter for each 5.7 ums of motion of the reticle 117 in the z-direction with respect to lens 13. Non-telecentricity on the object side permits control of magnification.

This design allows use of a six degree of freedom chuck 130 to adjust magnification of each camera independently and precisely, rather than rely upon having lenses of identical focal length (difficult to achieve within the necessary tolerances). Fold mirror 99 folds the optical path so that lenses 13 and 15 can be positioned more closely to one another without the reticle carriers 115, chucks 130, and condensing lenses 95 interfering with one another; and closer lens positioning enhances image accuracy.

FIG. 23 shows the details of the six degree of freedom reticle chuck 130. The entire assembly mounts on support flexures 132 above the main projection lens 13, directly on the lens support 26. Three piezoelectric drivers 84 control the distance between the lens and the reticle. These drivers move small distances parallel to the optical axis to correct magnification errors. If any two drivers 84 are driven relative to the third, the tip and tilt ($\phi_x$ and $\phi_y$) of the reticle chuck 125 is adjusted. This eliminates trapezoidal error in the imaging system. Piezo drives 84 position intermediate frame 140, which supports voice coil drivers 129, 131, and 133, flexure assembly 120, and reticle chuck 125. (The coil drivers may be of the type disclosed in Borner U.S. Pat. No. 3,569,718). Voice coils 129 and 131 move together to adjust the alignment of reticle 117 in the X direction. If they move different amounts, they also serve to adjust alignment in the $\phi$-direction (rotation about the optical axis). Coil 133 is used for Y-direction adjustment. Each piezoactuator and voice coil contains a local position transducer which enables the control computer to reposition the drive at the correct alignment position (stored in the calibration data base 33DB) after power up or recalibration.

Reticle carrier 115, shown in FIGS. 7–10, 20–22, and 27, holds four reticles 117 in openings 116. When a new reticle is needed, carrier 115 is driven by air cylinder 128 toward the reticle (to the left in FIG. 21), moving on slide 122. Pneumatic controls turn on vacuum on reticle carrier 115 and release the vacuum in reticle chuck 125. In this manner reticle 117 is passed to carrier 115. Air cylinder 128 then returns slide 122 and carrier 115 to the reticle changing position (to the right).

Figure 27:
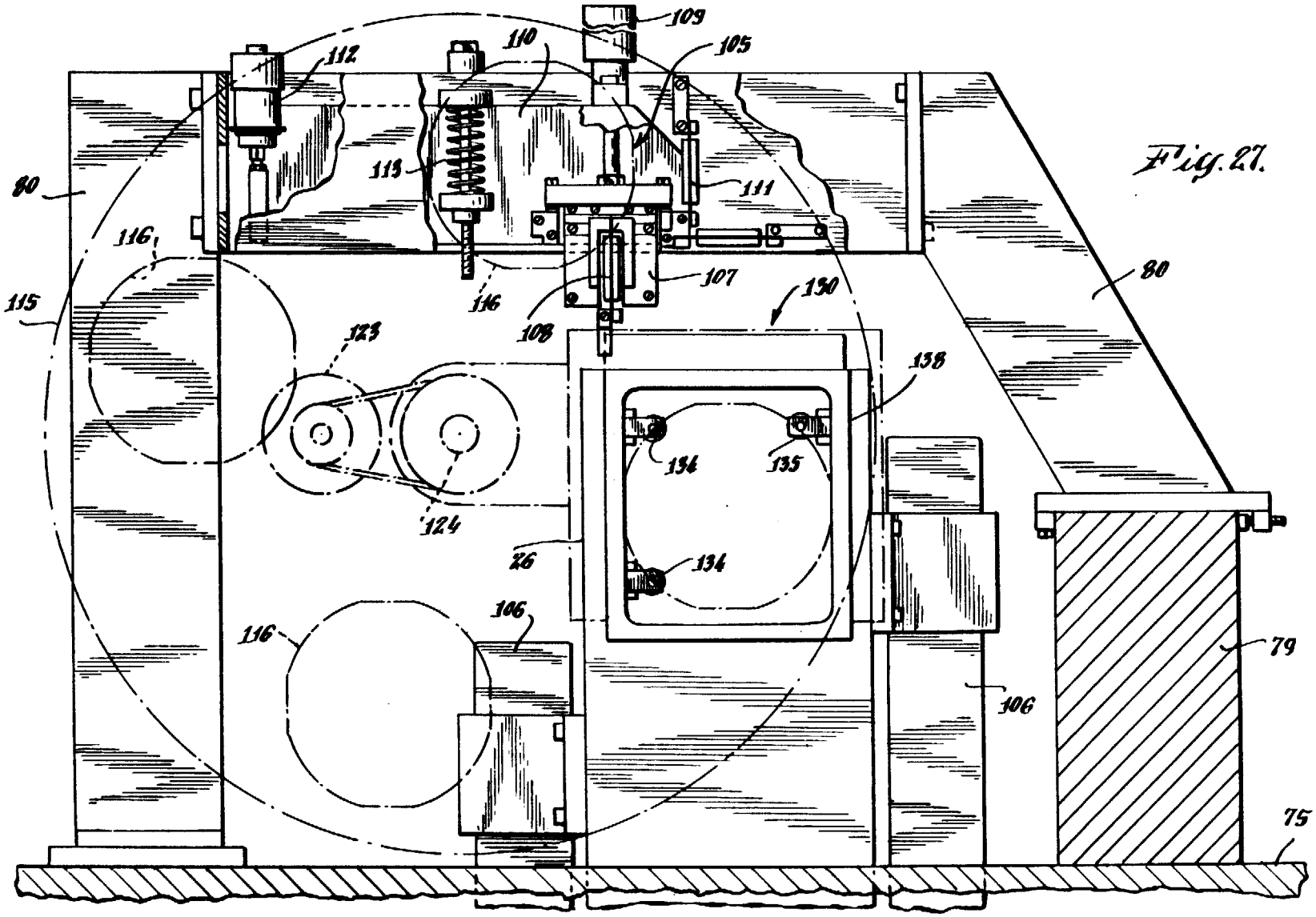
FIG. 27 is a vertical section, partially broken away, taken on line 27—27 of FIG. 7, showing the support system for the right optical column.

Reticle carrier drive assembly 124 includes reticle carrier 115 which rotates, driven by motor 123, to place the new reticle in position opposite chuck 125. Carrier 115 is again moved to the left onto locating pin 126. The reticle is then handed off to reticle chuck 125 by reversing the above sequence. In-column alignment reference marks 134, seen in FIG. 27, are then used to precisely align the reticle to the top of the optical column 26. If subsequent checks of reticle alignment, using the in-stage calibration unit 227, as described below, show that reticle alignment to the in-column marks 134 is incorrect, a programmable offset is entered into the system calibration database 33DB and is used to offset the alignment of the in-column system the correct amount, re-establishing its proper calibration and alignment.

The above subsystems, lens 13, mirror 99, six degree of freedom stage 130, and reticle carrier 115 are all mounted on lens support 26, which is connected to camera support 83 by the Z-axis air bearings 106 (FIGS. 23 and 24). The Z-axis drive 105 (FIG. 27) supports the whole assembly, and provides Z-axis motions. Air cylinder 109 can be used to raise the whole assembly nearly 50 mm, allowing easy exchange of substrates under the lens. Fine drive of Z, for automatic correction of focus, is provided by voice coil 112, which drives pivoted support arm 110, mounted on pivot flexures 111. Movement of arm 110 drives lens support 26 through flexure linkages 107 and 108.

Figure 17:
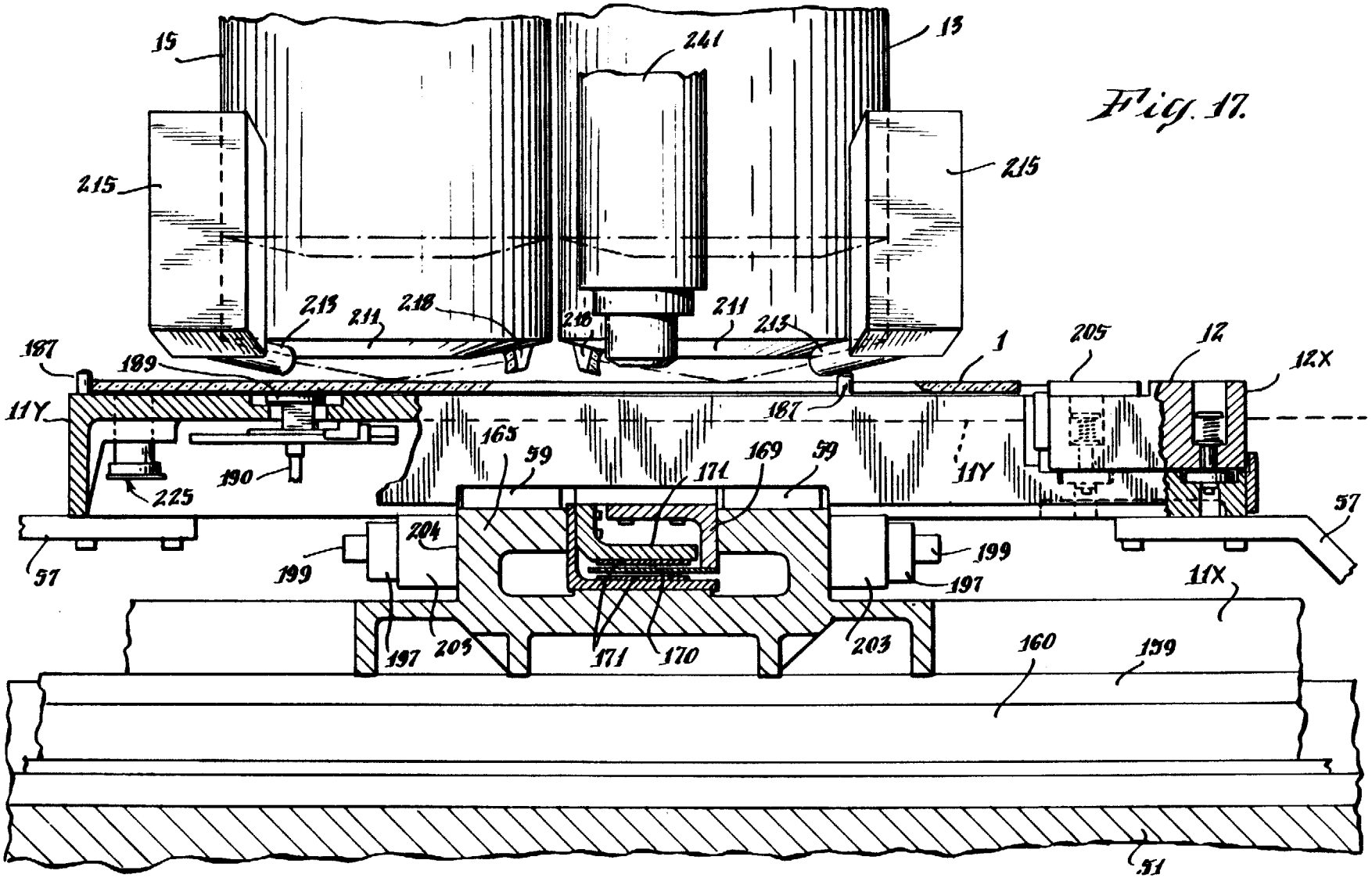
FIG. 17 is a vertical section taken on line 17—17 of FIG. 8 showing placement of the dual lenses relative to the substrate.

Autofocus is provided by autofocus sensor 213 mounted in close proximity to the bottom of lenses 13 and 15 (FIG. 17). The autofocus sensor 213 monitors the distance between the bottom of the lens and the top of the substrate. The error signal developed by the sensor is used to drive the Z-axis drive 105. The autofocus sensor projects a beam of visible or invisible light (of a frequency that will not affect the photosensitive coating on the substrate) from a light source 215 onto substrate 1 to a point directly under the lens 13 on its optical axis. It is received and reflected back by mirror 218 to the substrate and then to a collector. The beam is then collected by the sensor in a manner similar to that in common use on wafer steppers (such as disclosed in Tigreat U.S. Pat. No. 4,447,185). By proper arrangement of slits, lenses and detectors, small changes in lens to substrate spacing are monitored and corrected.

The individual focus sensors mounted on each lens allow individual focus of each camera, thereby correcting for substrate and stage height variations that occur between cameras. By providing constant, sharp focus, the total panel image can be built up of precisely controlled image pieces that match each other so closely that the subtle differences that remain are invisible to the human eye.

The spacing between the two cameras is adjustable, so that a standard value of column spacing 3 (FIGS. 4 and 6) (such as our 165.000 mm spacing) can be provided on all machines. A differential screw drive is fixed at the front of the right-hand camera to move it in the x-direction; the left-hand camera is considered fixed. Bridge support 79 acts as a guiding surface for this motion. The two cameras are placed on the bridge in approximate position, a test reticle is aligned on each camera, and the instage calibration unit 227 is used to measure the remaining error in the column spacing 3. The differential screw drive is then moved the desired amount, to remove most of the remaining error.

It is assumed in the system design that after the above X axis adjustment, some small (about 2.0 um) error may remain in both X and Y axes. The motion of the reticle alignment chuck 125 includes enough travel in the X and Y directions to accommodate the remaining adjustment. After the physical adjustment described above, the pop-up calibration unit 227 and the X, Y laser metered stages will be used to locate projected reticle images 5 for each column, as described below. Any error in the exact column spacing can be calculated from the measurement data, and used to offset the reticle alignment origin (stored in the calibration database 33DB) in the direction and amount required to bring the column spacing into exact adjustment. In this manner, the column spacing is set and maintained at an exact value.

Each reticle may contain more than one image pattern, even though only one is to used at a given time. Field stop assembly 121 (FIGS. 7, 8, 21, and 22) is positioned in the optical path between the reticle carrier 115 and the condenser 95. It serves to delineate the portion of a particular reticle that is to be used. Assembly 121 includes a pair of horizontal blades 137, driven by motors 149, guided by ball slide 146, belts 139, and guide slot 148; also, a pair of vertical blades 141, driven by motors 150 guided by ball slide 145, belts 143, and vertical guide slots 147. These blades may form any shape rectangle, providing a field stop for any part of the reticle. Assembly 121 is not, and need not be, in the plane of focus of lens 13 or 15 since the patterns on the reticle are spaced and so need not be exactly delineated by the field stop assembly. (A form of assembly is disclosed in Hill U.S. Pat. No. 3,980,407, though the Hill structure, in contrast to ours, only moves symmetrically).

Finally, each optical system 29 includes an illuminator housing 90, which contains a mercury lamp 91, mirrors 93 to direct the light, and exposure control shutter 97, and a condensing lens 95 which directs the light through the field stop assembly 121 to reticle 117 and from there off mirror 99, through lens 13 or 15 onto substrate 1. A sensor is included in each illuminator to monitor exposure dose, so that the exposure energy for each system will be the same even when the lamp outputs and the optical efficiencies of the two cameras differ.

5. The Stage Motions And Support

Patterning a 450 mm square area requires a large, and, therefore, heavy stage. Aluminum stages weighing nearly 100 kg are used. While the use of two cameras simultaneously can reduce the travel required in one axis by 2X, initial calibration is best accomplished using 450 mm of travel in both X and Y. A massive, stiff structure is therefore required to provide rapid stepping and stable optical systems. To achieve this, a structure weighing nearly 5,000 kg is used (FIGS. 7–10, 20, and 27). Granite base 51, weighing 3,000 kg, rests on commercial vibration isolators 53, which reduces transmission of building vibrations. Nodular legs 77 (Mehanite)-support bridge 75. Granite bridge 75 weighs nearly 1,000 kg and supports both optical systems 29. Each optical system, including light source, weighs about 250 kg. Legs 77 are stiff enough to maintain high servo-drive bandwidth. The roughly 75 kg of assemblies mounted to the lens support casting 26 are supported by Z-axis drives 105. This entire structural assembly provides the stability and stiffness needed to step large stages rapidly, image high resolution patterns, and maintain system calibration.

X-motion stage 11X moves along the top of base 51, supported on frictionless air bearings 55, and guided by air bearings 158 which move along the X-axis guide keys mounted in a slot in base 51, as shown in FIGS. 7 and 11. The guide bearings provide torsional stiffness of the X-axis motion stage 11X. Stiffness of 10,000 kg/mm are needed in these bearings to provide high gain servo control of the combined X and Y axes.

Figure 9:
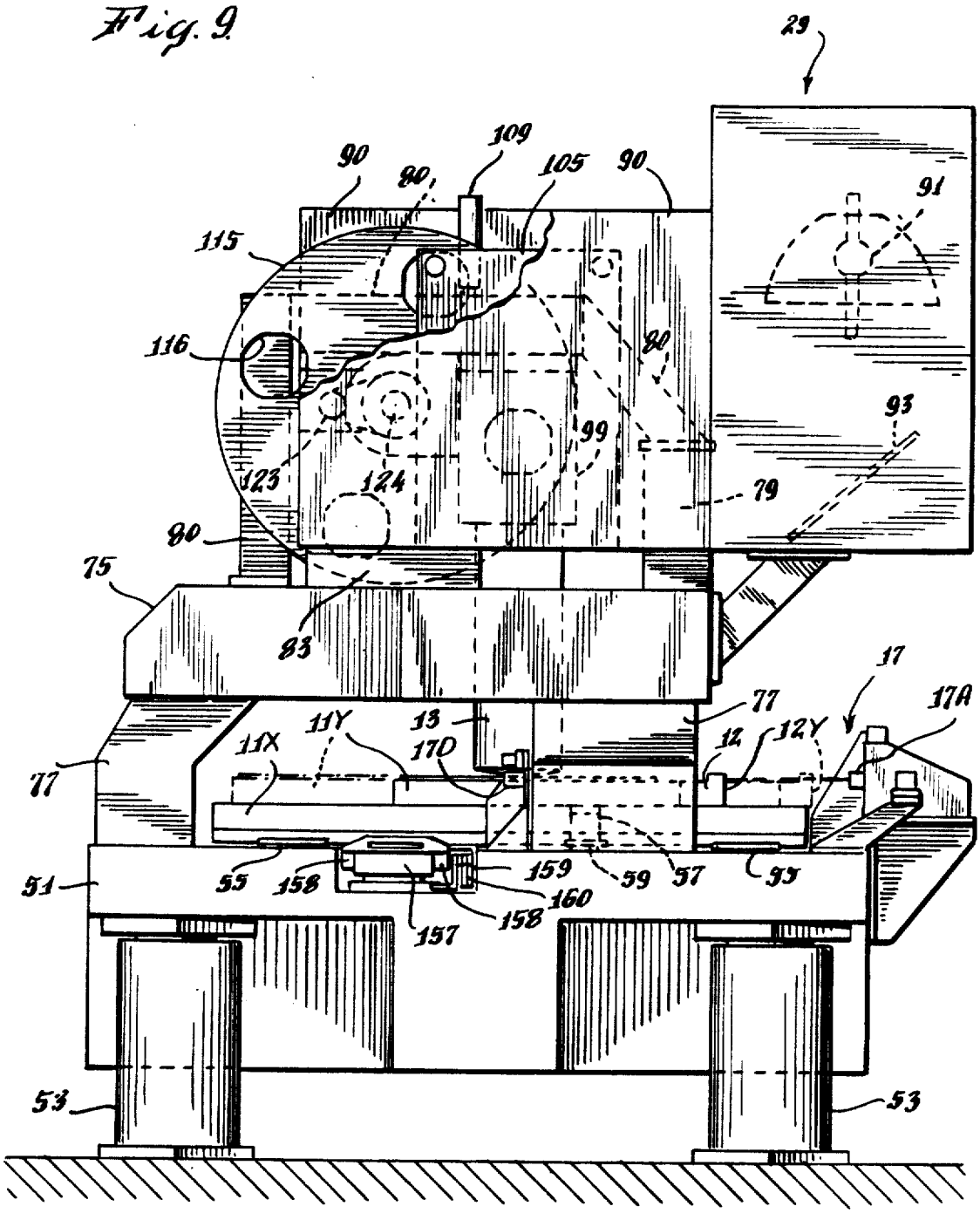
FIG. 9 is a right side elevation of the imaging system.

X-motion stage 11X is driven by a commercial linear motor 159 (FIG. 9). The stator 160 for motor 159 consists of two rows of permanent magnets mounted to base 51. The armature 161 consists of a set of movable copper coils mounted from the stage so that it is centered between these two rows of magnets. Current in the coils provides thrust to move the stage. Precise control of the current, provided by digital servo loops, fine digital-to-analog converters (DAC's), and linear power amplifiers allows high speed coarse positioning and lower speed fine positioning to 0.10 um with no moving friction parts to wear out or inhibit precise stage positioning. Stops limit the motion of the stage at the ends. This design provides the capability needed to move the heavy stages precisely, without particle contamination, for the more than 20,000,000 steps per year anticipated in high volume production applications.

Figure 12:
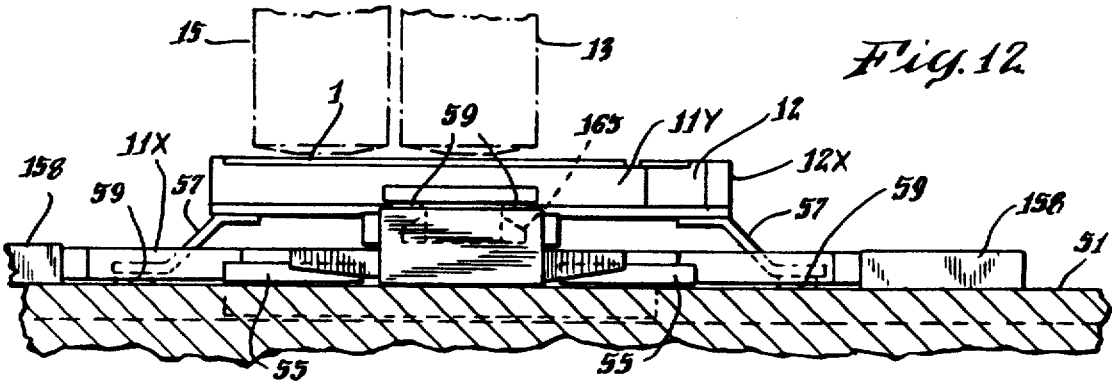
FIG. 12 is a vertical section taken on line 12—12 of FIG. 11 providing further details of the stage-moving means.
Figure 13:
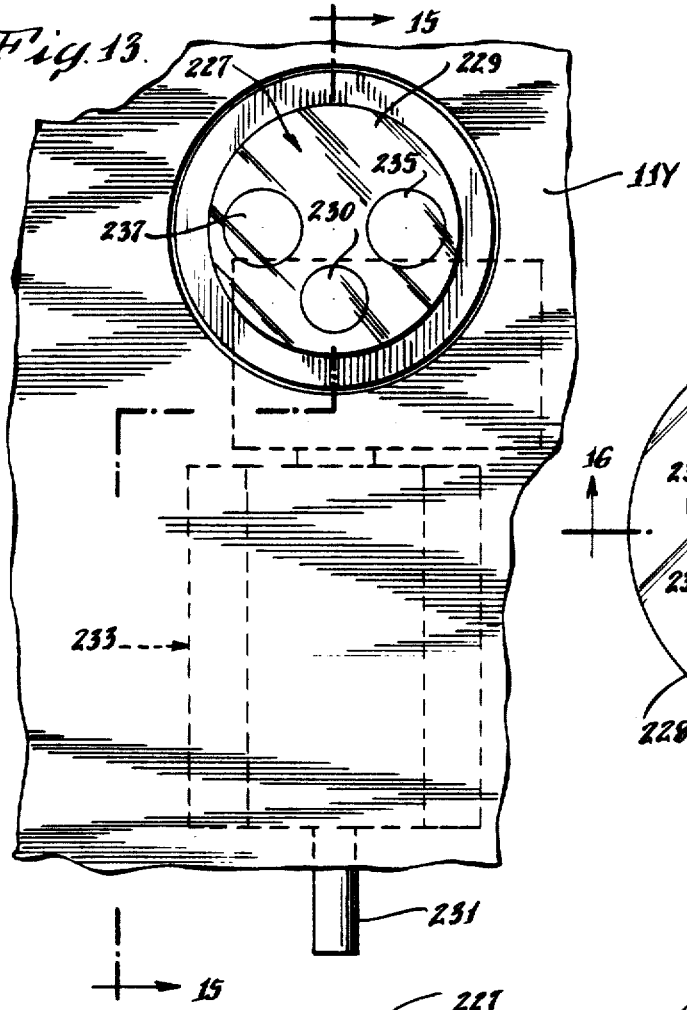
FIG. 13 is a partial top plan view of the in-stage calibration unit.

The Y guide key 165 is an integral part of the X stage 11X, and provides orthogonal motion guidance for the Y stage 11Y (FIGS. 11 and 12). The Y stage is supported on three lift bearings 59. Two of these lift bearings 59 ride directly on the base 51, at the rear of the stage, under mirror 12Y, as can best be seen in FIG. 10. The third Y lift bearing 59 rides on top of the X stage. This design allows a 25% reduction of the size and weight of the Y stage, and permits easy service access from the rear. Linear motor 169, mounted within the Y guide key 165, provides the drive force to move stage 11Y in the Y direction; stator 171 is mounted to stage 11X, armature 170 is mounted under stage 11Y. Control of motor 169 is the same as described above for the X-axis linear motor 159.

As can be seen in FIGS. 6–10, laser interferometers 17, using laser 24, reference stage mirrors 12 to determine stage position. (Interferometers are of the type disclosed in Sommargen U.S. Pat. Nos. 4,688,940 and 4,693,605). Interferometer 17D works with stage mirror 12X and mirror 18 mounted on lens 13 to monitor X position. Interferometer 17B works with stage mirror 12Y and mirror 14 mounted on the rear of lens 13 to monitor the Y position of the stages relative to the right-hand lens. Interferometer 17C works with stage mirror 12Y and mirror 16 mounted on the rear of lens 15 to monitor the Y position of the stage under the left-hand lens.

Due to the nature of X and Y motions, small yaw rotations will occur in the as-built stages. Thus the Y positions determined by interferometers 17B and 17C will differ slightly. The system controls consider the true position to be that measured by interferometer 17B. The difference in distance measurements between the two interferometers represents the error in Y under lens 15 due to stage yaw. If left uncorrected, this error can exceed 1.6 um, which is too large.

Figure 18:
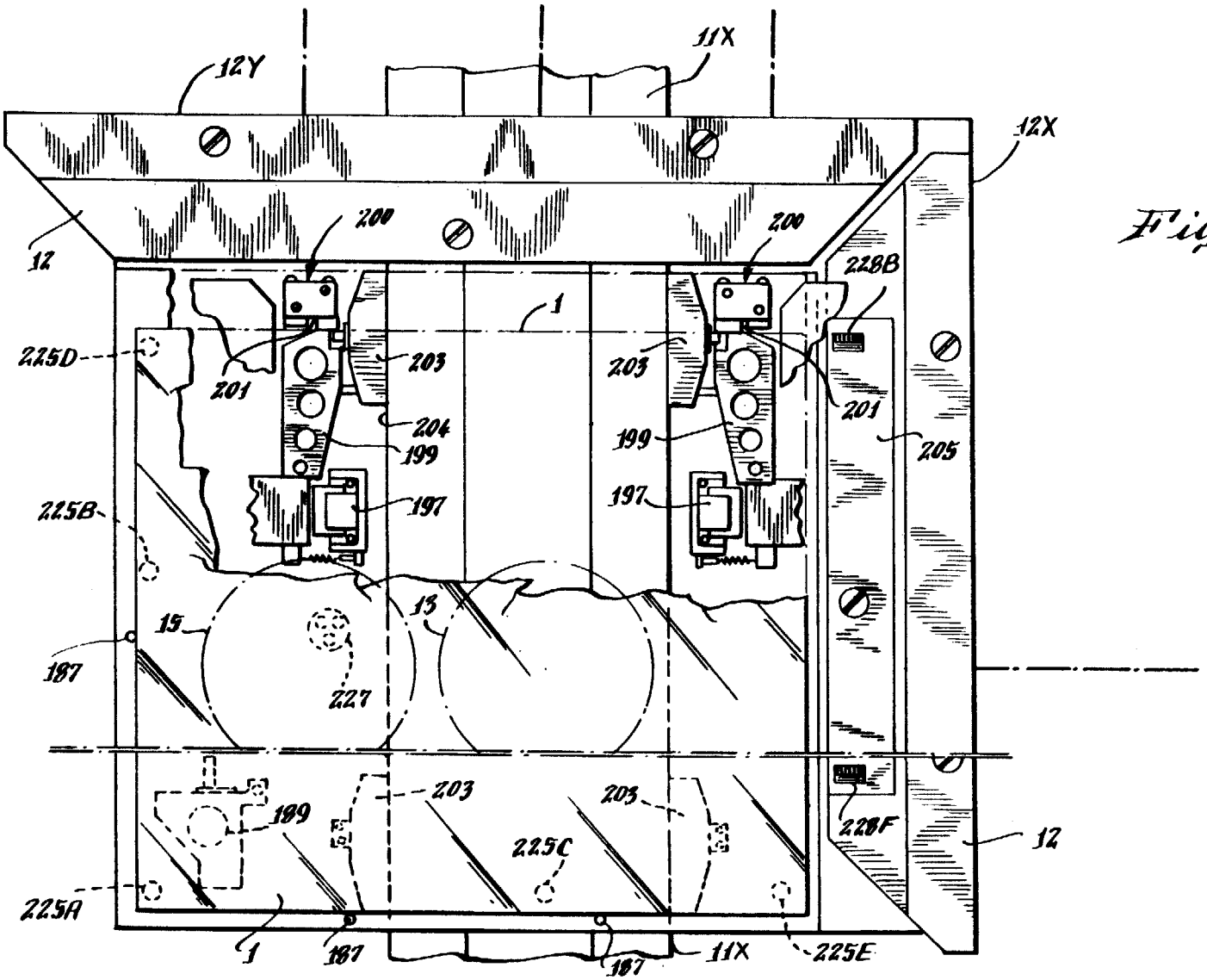
FIG. 18 is a plan view of the stage showing the transmission alignment system and the $\phi$-drive used for aligning the substrate with the reticles.

To meet the tolerances required, this yaw error must be not only measured, but corrected, FIG. 18 provides a cutaway view through the Y stage and shows the yaw correcting guide mechanism 200. The front two guide bearings 203 are fixed, while the rear two are mounted to lever arms 199. These levers are attached to the Y stage through pivots 201; they are driven by voice coils 197, as shown. Servo current applied to the coils causes the Y stage to rotate slightly, until the yaw error at lens 15 is removed.

Figure 10:
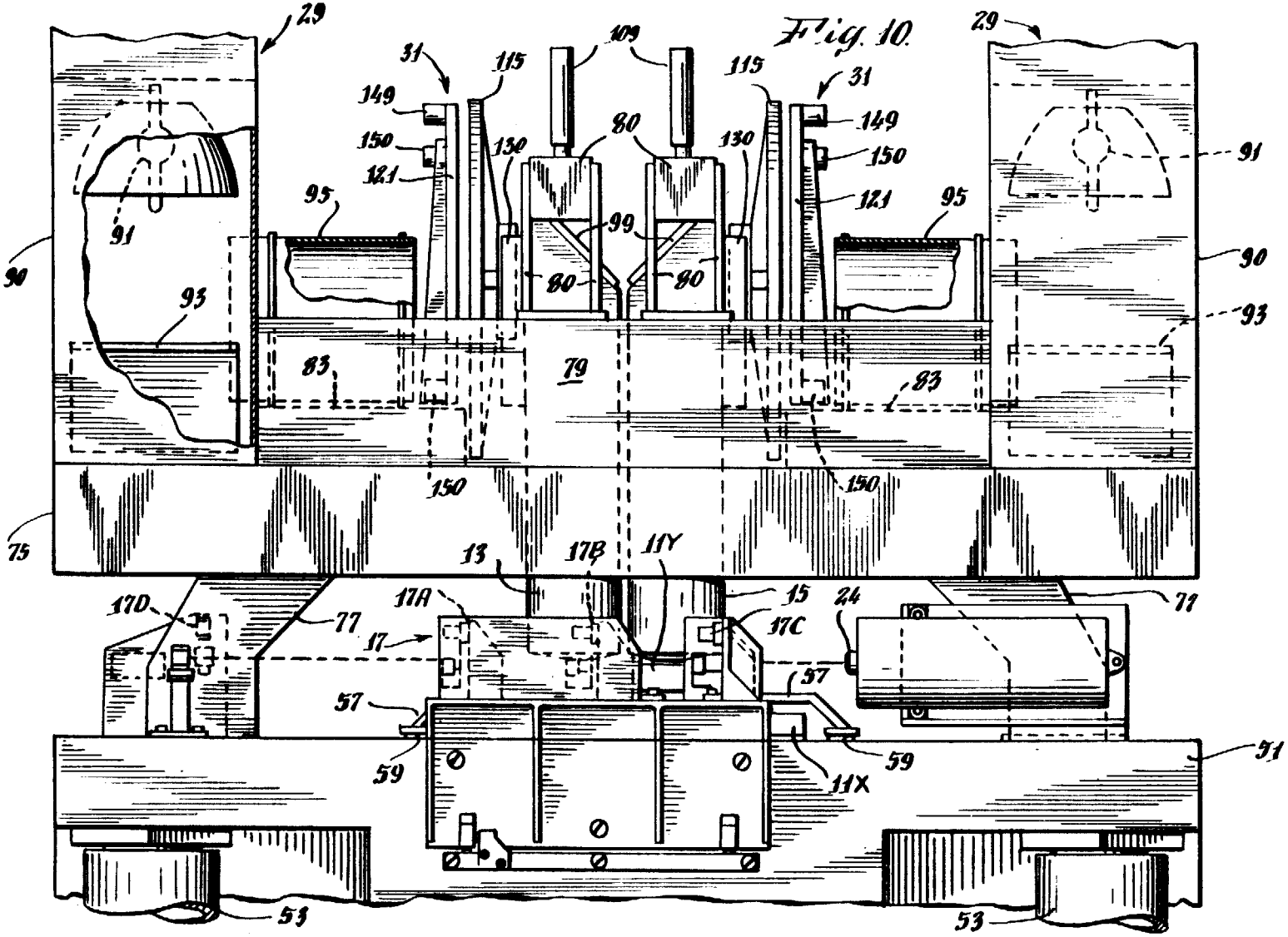
FIG. 10 is a rear elevation showing the optical columns and the laser interferometer systems for measurement and calibration.

When stage 11Y is moved in X to the far right, see FIG. 10, the laser beam from interferometer 17C will fall off the left end of mirror 12Y. During normal two camera operation, such travel is not required, and mirror 12Y need not be made longer. However, during initial system calibration the full travel is used. In this case, the mirror 12Y is too short, and active yaw correction is lost. Rather than make mirror 12Y longer, making stage 11Y larger and slower, and making the whole machine larger too, a third interferometer 17A is provided to the right of 17B. As can be seen in FIG. 6, the beam from 17A picks up mirror 12Y just before the beam 17C passes off the other end of mirror 12Y. While all three beams are on mirror 12Y, the control of stage yaw position is passed by the system controls from interferometer 17C to 17A. In this manner active yaw control is maintained. While interferometer 17A does not reference any optical column, it need not, because in this range of travel, only lens 13 is in a position to image onto the substrate 1, lens 15's optical axis having passed off the left edge of the substrate a approximately the same time as the beam from interferometer 17C passed off mirror 12Y.

The Y stage carries several sub-assemblies (FIGS. 11 and 18). Lift pins 188 are pneumatically driven and lift substrate 1 so that it can be removed from the stage by automatic material handlers. When a substrate is loaded onto the stage, it is placed on top of lift pins 188. These pins then lower the substrate to the stage surface. The vacuum line 190 in banking chuck 189 is turned on; the mechanism attached to banking chuck 189, which is below the stage, then pushes substrate 1 gently against banking pins 187 which reference the front and left edge of the substrate, thereby locating substrate 1 in approximate prealignment on top of stage 11Y. As shown in FIG. 11, three or five transmission alignment system units 225A–225E are mounted in the stage under the edge of the substrate. The location of the in-stage calibration unit 227 is also shown.

Stages 11 provide no separate mechanism for rotating substrate 1 with respect to the stage mirrors. Such mechanisms are common on wafer steppers, but detract from stepping and positioning performance. The large size of LAED substrates, as compared to silicon wafers, and the fact that their edges are flat and nominally orthogonal, allows the plate loading and prealignment just described to position LAED substrates adequately so that only fine correction is required. In this apparatus, this fine correction can be made using the X, Y and yaw mechanisms just described or the six degree of freedom chucks 130.

6. Sensing And Referencing Systems

Systems built into our apparatus provide substrate alignment and system setup and calibration. The methods which employ these sensors and referencing systems will be described in the next section. The construction of each sensor and reference is described here.

Stage 11Y contains five transmission alignment system sensors, as shown in FIG. 11. In general, sensor 225A, mounted in the corner, and sensors 225B and 225C will be used for smaller substrates, while sensors 225A, 225D, and 225E will be used for larger substrates, though all five may be used on large substrates. All five sensors are the same; a sectional view of one is shown in FIG. 19.

Figure 19A:
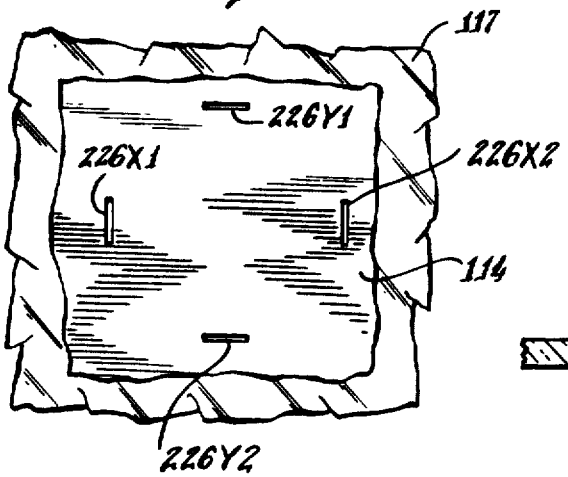
FIG. 19A is a plan view of a portion of a reticle, showing alignment slits.

Reticle 117 contains transmission alignment system slits 226, as shown in FIG. 19A. The surrounding area is opaque; slits 226 are clear, creating small slits of light when shutter 97 is opened. Field stop assembly 121 is used to mask all but the transmission alignment system slits of the reticle, so that undesired exposure of the main pattern doesn't take place during transmission alignment system use.

Figure 19B:
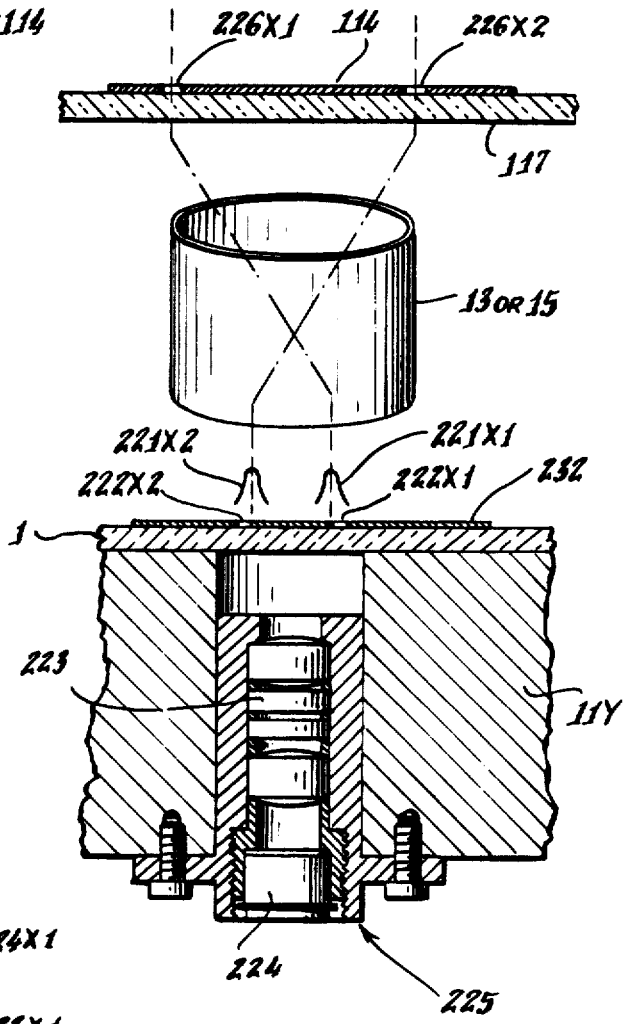
FIG. 19B is an illustrative vertical section showing the relationship of the slits of FIG. 19A to the lens and the transmission alignment sensor in the stage.

The light from slits 226 is imaged by lens 13 or 15 onto substrate 1, where a corresponding set of four slits 222 partly blocks the light from the reticle, as shown in FIG. 19B. Light passing around substrate slits 222 is gathered by lenses 223 and focused onto quadcell detector 224, as shown.

Figure 19C:
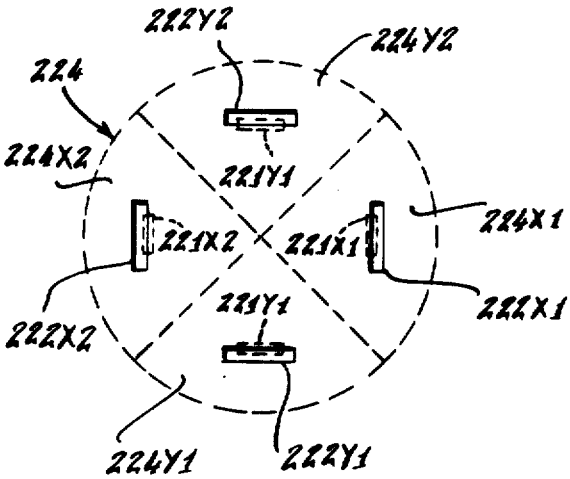
FIG. 19C is a plan view of the four sensors in a quadcell detector in the stage and showing the relationship of the four sensors to the slits in the in-stage calibration unit of FIG. 14.
Figure 20:
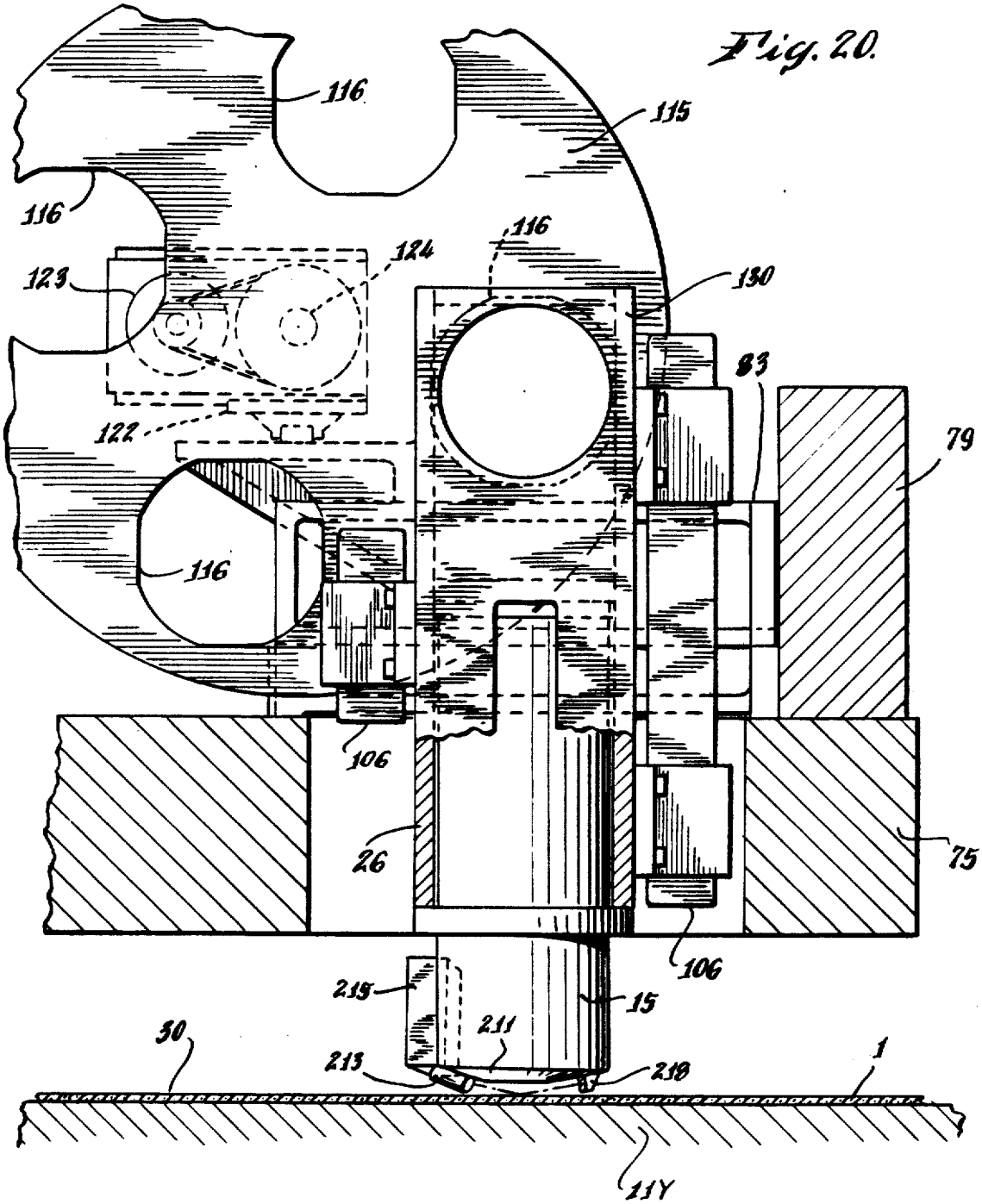
FIG. 20 is a vertical section, taken on line 20—20 of FIG. 8, showing the optical column and reticle mount for the left-hand camera. It shows the unit as if split in the middle and shown in vertical elevation.
Figure 21:
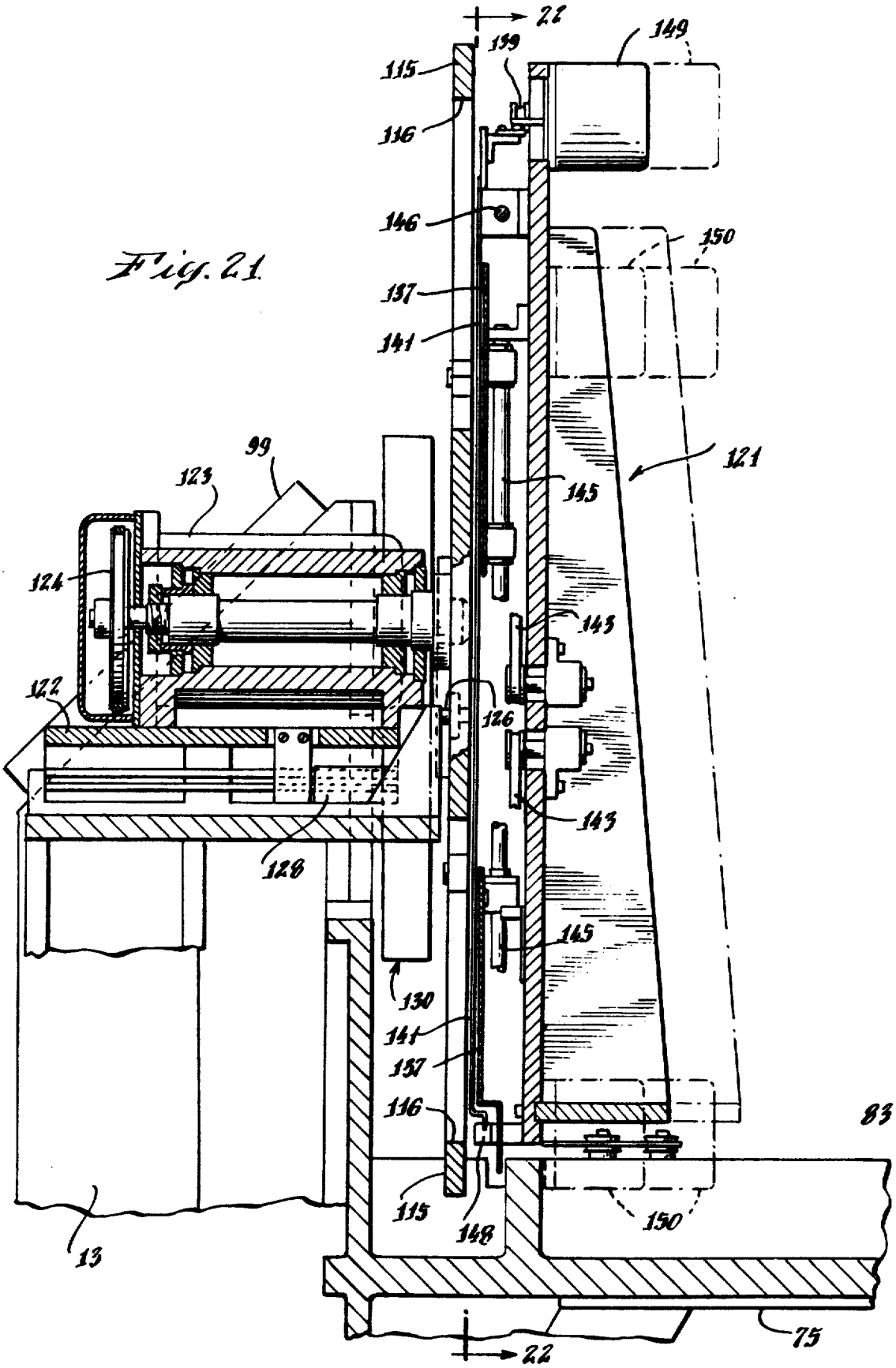
FIG. 21 is a vertical section (partially broken away) taken on lines 21—21 of FIGS. 8 and 22 of the right-hand reticle changer and field stop assembly.
Figure 22:
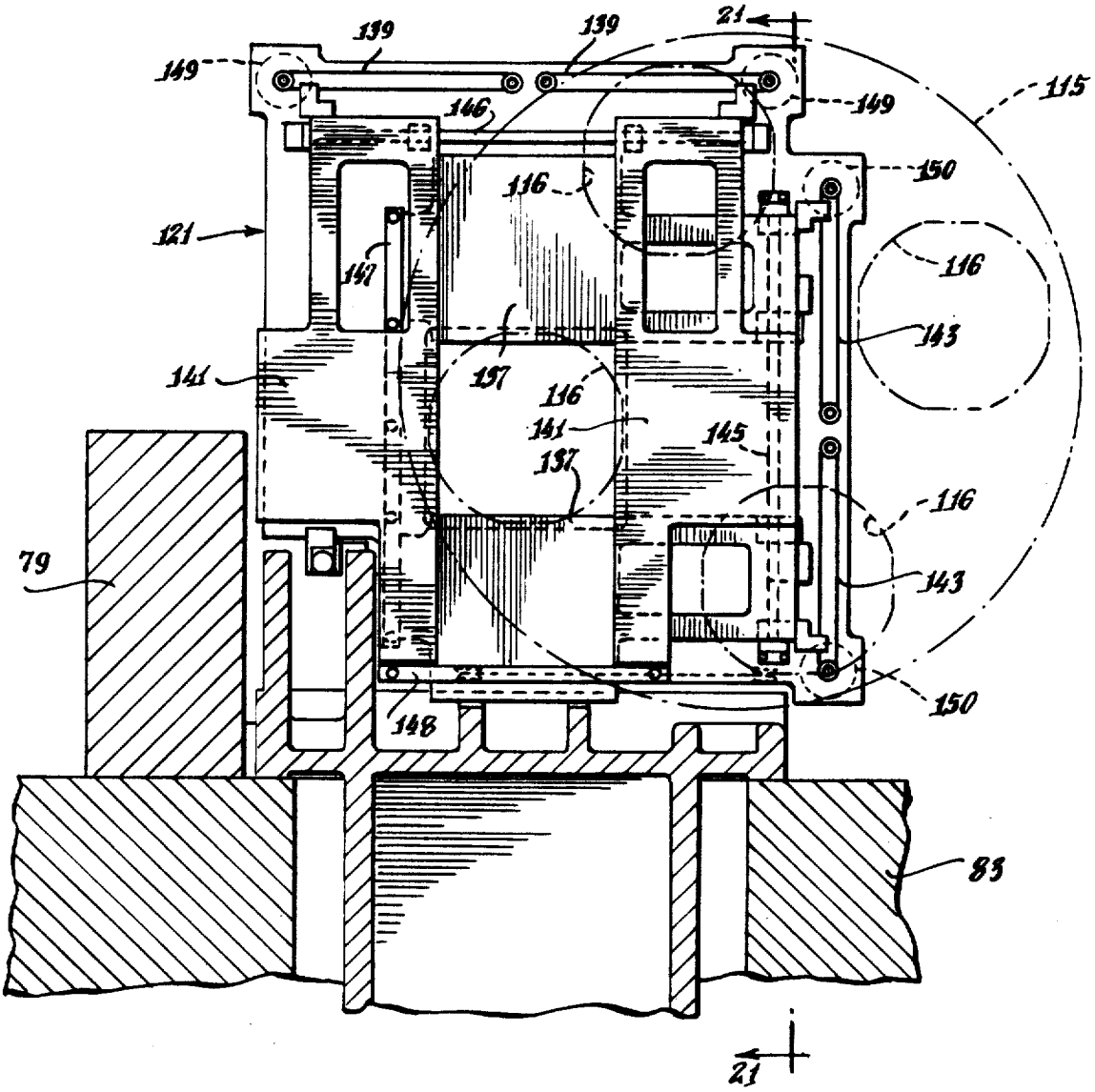
FIG. 22 is a side elevation of the reticle carrier and field stop assembly.

The arrangement of the four detection cells of detector 224 is shown in FIG. 19C. As can be seen, the energy from each reticle slit 226 falls separately onto its respective portion of the quad cell detector. When a substrate is loaded onto the stage, banking chuck 189 pre-aligns the substrate so that slits 222 fall roughly over transmission alignment system unit 225 at all locations. Quad cell detector 224 is large enough so that precise prealignment of substrate 1 to detector 224 is not needed. The stage is then moved in X and Y directions until transmission alignment system unit 225 is placed under the image of reticle slit 226 projected by lens 15 from a reticle aligned on the left camera. At this point in the procedure some misalignment will exist. For example, slit 226Y1 could fall entirely onto quadcell 224Y1, while slit 226Y2 falls entirely onto the opaque area of substrate 1. By comparing the signal from 224Y1 and 224Y2, this imbalance can be detected. It can also be determined which direction of misalignment exists. By moving stage 11Y to the rear, in this example, slits 222Y1 and 222Y2 can be moved until they are centered directly under slits 226Y1 and 226Y2. The Y position at which this balance is achieved is recorded in the system data base 32DB, as the desired Y location for alignment at location 225A.

The same process is repeated for the X direction at location 225A. This process is then carried out at the other transmission alignment system locations, using whichever lens (13 or 15) and reticle that is appropriate. Note, in actual practice, several iterations of X and Y alignment at any one transmission alignment system location are required before precise alignment of both axes is achieved. Also, the area around slits 222 need not be opaque; it simply must block some of the light energy from slits 226, enough to create a measurable asymmetry in the misaligned images.

The transmission alignment system directly references projected images at the exposure wavelength. This is the most direct alignment method, and, therefore, the preferred method. By making the transmission alignment system sensors small, multiple sensors can be easily included around the stage area, thereby avoiding the need for a large hole and viewing microscope intruding up through the stage assembly, as is common on most transmission viewing systems. Thus, the compactness of the transmission alignment system units is a key to the practical use of transmitted light for alignment. It should be noted that at the end of the transmission alignment system alignment process just described, the location of the substrate in X, Y and rotation is known from the three position measurements just made. The X length, the Y length, and the angle between X and Y can also be determined. In this manner, six degrees of freedom of alignment of the substrate can be achieved. The use of this data to place the next layer of images correctly over the existing layer(s) is described later.

Some substrates will be opaque, and must therefore be viewed from above. A reflective alignment system 241 is provided for such substrates. It is mounted near the bottom of the right lens 13, as shown in FIG. 17. This unit consists of a combined dark field and bright field microscope. A built-in focus sensor is provided to eliminate small, residual non-telecentric effects in the reflective alignment system. The image of reflection alignment system mark 228 from the substrate is magnified by this microscope onto a charge coupled device ("CCD") array which is connected to a commercial image processor in the system controls. The processor analyzes the magnified image of mark 228 and determines its location in X and Y directions; from this analysis alignment corrections can be determined as above. Again, by measuring the X and Y location of three separate substrate marks, X, Y, $\phi$, scale X, and scale Y alignment can be achieved using the reflective alignment system unit.

Note that the reflective alignment system unit 241 does not directly reference marks on reticle 117; instead, the CCD array is used as a TV camera and provides an intermediate position reference. As a result, the relationship between reflective alignment system unit 241 and projected reticle images must be separately established during system calibration, and maintained thereafter, even during power downs and restarts. An in-stage calibration unit 227 is provided in stage 11Y for this purpose.

Figure 15:
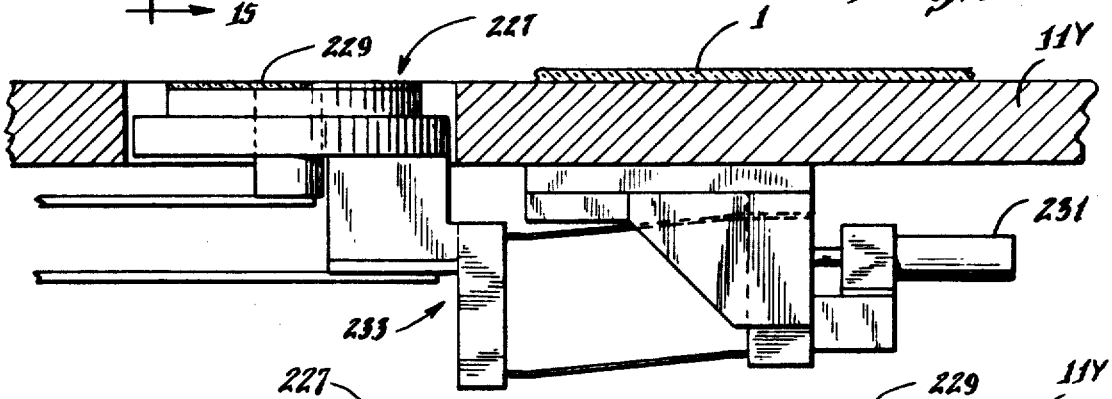
FIG. 15 is a vertical section taken on line 15—15 of FIG. 13 showing a portion of the in-stage calibration system.
Figure 16:
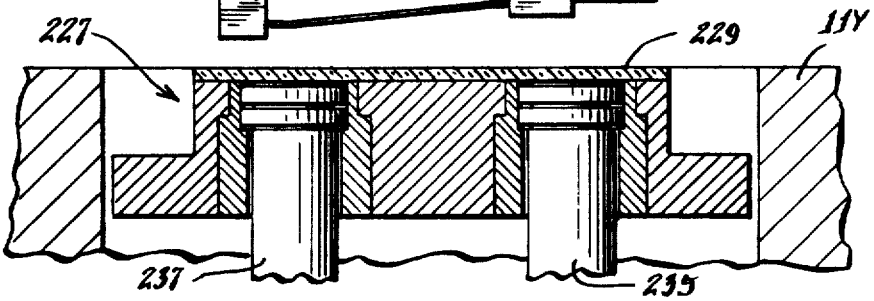
FIG. 16 is a vertical section taken on line 16—16 of FIG. 14 showing two of the sensors in the in-stage calibration system.

When no substrate is present on stage 11Y, in-stage calibration unit 227 (the "pop-up" unit) is raised by air cylinder 231 to place its top surface, the top surface of glass disc 229, at image plane 30. On wafer steppers, simpler units have been fixed at the image plane, inside the rectangular range of stage travel, but outside the circular area to be patterned (See Johannsmeier U.S. Pat. No. 4,414,749 and Tanimoto U.S. Pat. No. 4,629,313). For LAED's this unused area often doesn't exist; the rectangular substrate may entirely fill the stage area. If such a sensor unit were mounted below the substrate, undesirable Abbe offsets would occur. It is desirable, therefore, to lift the sensor package 227 to the image plane, as shown in FIG. 15.

Pop-up unit 227 contains three detector subsystems. Detector 235, a small light meter, is used to measure the intensity of exposure light coming through lens 13 or 15 at a small portion of the image field. By moving the X and Y stages around the image field of, say, lens 13, the uniformity of intensity of illumination for lens 13 can be determined. Shutter dynamics and exposure dose control behavior can also be measured.

Detector 237, also contained in the pop-up unit, has two narrow slits, one for the Y-axis and one for the X-axis, aligned with the respective axes. Filtering and detection are provided below the two slits. A test reticle, which contains an array of similar test slits, is used in conjunction with detector 237. The image of these slits is scanned by the X and Y stages, scanning slit 237Y and then slit 237X across the image of the test slits; during these scans, intensity vs. position data is collected and then analyzed to determine the resolving capability of the lens. If the lens performance is analyzed by stepping the lens along its optical axis, the position of best focus can be determined.

By placing the array of test slits at several locations on the test reticle, resolution and focus can be determined across the field of either lens, and, in this way, best focus for each lens can be determined. Once determined, the desired lens to substrate height is stored in the system calibration data base 33DB, and is then maintained by autofocus systems 213, mounted at the bottom of each lens.

Pop-up unit 227 also contains a transmission alignment system sensor 230, similar to 225 described above described above. Only now, glass disc 229 carries the transmission alignment system slits 222 normally provided by substrate 1. The test reticle contains an array of many transmission alignment system slits 226 placed around the object field. By moving the X, Y stages to the nominal locations of these slits 226 in the projected image, and then making a transmission alignment system alignment at each site, the exact location of the projected images can be determined, as was described above for the transmission alignment system. In this way a map of the projected image errors can be made. The system software analyzes this map, using known techniques, to separate X, Y, $\phi$, magnification, and trapezoid errors, and to balance residual distortion errors. See David S. Holbrook, "Projection Lens/Column Evaluation For Microlithographic Imaging: A User-Oriented Approach", Kodak Microelectronics Seminar, 1983, Kodak Publication No. G-151 (1984). Each of these error amounts is then used by the system software to determine offsets for the six degree of freedom alignment chuck 130 mounted above lenses 13 and 15. These offsets correct the image's errors. This procedure, using transmission alignment system-type detector 230 in pop-up unit 227 to measure and correct projected image placement errors is repeated until no further improvement can be made. In this way, each camera is set up automatically by the system controls to have minimum error, without the need for expensive, slow testing using actual exposures on substrates.

Sufficient X, Y stage travel is provided so that unit 227 can be scanned under both cameras, across the full image fields of both lenses 13 and 15. In this way, the location of images from both cameras is learned during the calibration procedure, and so is the spacing 3 between cameras. The measured X and Y error in camera spacing 3 is then stored in the system calibration database 33DB and is used to offset the right-hand camera's six degrees of freedom reticle alignment chuck 130 the necessary amount to align the two cameras precisely in Y and to space them our preferred 165.000 mm in X.

Figure 14:
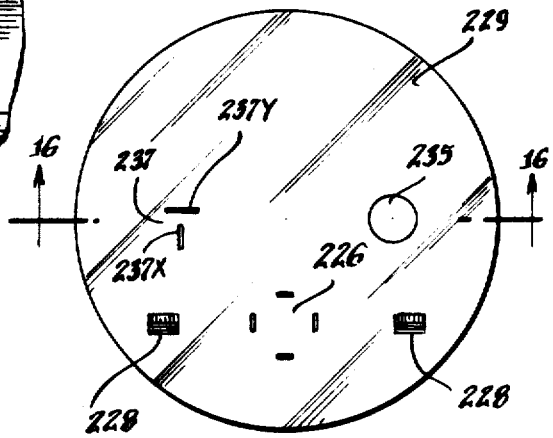
FIG. 14 is a plan view showing the alignment markings and detector geometries of the in-stage calibration unit.

Finally, the glass disc 229 used with the pop-up unit contains reflective alignment system alignment marks 228 (FIG. 14). When the X, Y stages place the pop-up unit 227 at the desired location for the reflective alignment system 241, an alignment measurement is made with the reflective alignment system unit. Any error in this alignment is considered an error in the location of the reflective alignment system unit. Again, an offset is stored in the system calibration database 32DB and used to correct later alignments. Note that by using an in-stage calibration unit 227 to locate the optical axes for lenses 13 and 15, and to locate the reflective alignment system unit, these three optical axes can be precisely located relative to each other. Since only small errors of the order of a few micrometers are expected, all corrections can be made in the system software, to bring each axis to its exact desired position. In this way the indirect referencing problem inherent in the reflective alignment system 241 is corrected, projected images from each column are brought into calibration, and camera spacing 3 is measured and corrected.

Scale 205 which is used for velocity of light (VOL) correction can be seen in FIG. 17, rigidly mounted on stage mirror 12X. Conventional means for measuring the index of refraction of air have at least 1.5 ppm residual errors. Across 450 mm of travel, an error of some 0.68 ums could occur, which is too large. A better means for measuring VOL is needed. Prior art reference systems operate only so long as power is not lost; on power up, they provide no absolute reference. (See, for example, Hewlett Packard Technical Data Bulletin on HP 10717A Wavelength Tracker).

The apparatus of our invention includes scale 205, made of zero expansion material (such as Zerodur) to provide better VOL reference. The reflective alignment system unit 241 is used to measure the location of reflective alignment system marks 228B and 228F at the back and front of this scale, respectively. The original length, which is known, is stored in the system calibration database 32DB. Upon subsequent power up, or as needed, this scale is remeasured using the X, Y stages 11 and the reflective alignment system unit 241. Any change in measured length represents a change in VOL from any cause. This data is used by the system software to correct the factor used to convert fringe counts into millimeters of travel, as is normal in laser interferometry.

Changes in focus or magnification of lenses 13 and 15 caused by a change in air index can be compensated for by direct measurement with the in-stage calibration unit 227, or by deduction, in the software, using models for the lens behavior derived from the original lens design modelling. Deductive correction will generally be quicker, therefore preferred. Note that adaptive behavior can be included in the software system, whereby the anticipated change is predicted using the deductive models, and is checked using unit 227. The residual errors detected can be used to modify the deductive models until good agreement between these models and actual system performance is achieved.

Yaw adjustment mechanism 200 and interferometers 17 provide no precise origin for X, Y or $\phi$ upon power up. Scale 205 serves as the origin for X and Y. The reflective alignment system unit 227 is used to measure the X and Y locations of mark 228B, on scale 205. The system software treats this location, then, as the origin of X and Y travel. Reestablishment of the $\phi$ origin is covered in the next section.

7. Machine Calibration And Correction

The apparatus, once assembled out of its component parts, will not, due to the precision required, operate to the desired tolerances. Even if the component parts are built to tight tolerances, this will be true.

Adjustments not found in normal single column designs must be anticipated and planned for in the system design and in the system integration plans. Then, successive iterations of calibration and adjustment must be carried out on the assembled machine until the desired level of integrated system performance is achieved. This level of performance must then be automatically maintained over the productive life of the machine. This is done through use of the sensors and reference systems just described, system software, and transfer functions, as will be described below.

To "photocompose" one circuit pattern from subfield images 5, as is shown in FIG. 4, the images must be formed accurately, and the distances between image centers must be stepped properly. The many adjustments described above provide the means for proper calibration and correction, but not the method. While many methods will work, the one presented here is believed to be the most efficient, and hence the preferred method.

The calibration of the apparatus is usefully divided into three phases: (1) initial system correction, (2) power-up correction, and (3) routine operational correction. Initial system correction begins with the X, Y stages 11, since all other measurements are referenced to these stages.

Once a system is operational, initial systems calibration is required. A "perfect" grid plate (with an array of reflective alignment system marks 228 positioned at known distances from one another in X- and Y-directions) is loaded onto stage 11Y. The locations of all these marks is measured with the reflective alignment system 241. Measured differences are assumed to be errors in the X, Y stepping matrix, or "grid" of the machine under test. For example, if the angle between the stage mirrors 11Y and 11X is incorrect by 2.0 arc sec, then 4.5 ums of error will be found across the 450 mm of travel. The amount of correction needed to shift the grid until it exactly matches the perfect grid plate is stored in the system's calibration data base 32DB and used to correct subsequent stepping patterns until an exact match has been made to the grid plate. In this manner, precisely matched stepping grids can be achieved on all tools, permitting, if desired, the imaging of successive layers on different tools.

The grid calibration procedure for the first machine built is more complex than that for successor machines. The problem is that no grid standard exists for the size area imaged by our apparatus (450 mm square). So the grid standard for the first tool must be constructed using an iterative method.

After rough calibration by known methods, an X, Y array of calibration marks is printed on a substrate. By successive steps of measurement (using the X, Y stages 11X and 11Y and reflective alignment system 241) the major grid errors can be discovered. (See, for example, M. R. Raugh, "Absolute Two-Dimensional SubMicron Metrology For Electron Beam Lithography," SPIE Proceedings, Vol. 480, May 3–4, 1984; J. Freyer et al., "Enhanced Pattern Accuracy With MEBES III," SPIE Vol. 471, 1984). The matrix of errors so discovered will be entered into the machine's X, Y stage corrections data base 32DB (in FIG. 5) as the stage transfer function, and thereafter used to offset commanded X, Y stage positions, thereby providing corrected stage placement at all X, Y locations. In this manner an improved tolerance for the X, Y stage stepping distances can be achieved. The calibrated machine is then used to step an X, Y grid pattern on a 450 mm square Zerodur (thermally stable) plate. This grid plate will record the corrected X and Y grid of the first machine and become the "perfect" grid plate used above.

Once the stepping grid has been corrected, the optical cameras 29 can each be corrected. In-stage calibration unit 227 (FIGS. 13, 15, 16, and 18) and the now corrected stages 11 provide the measurement means. Test reticles, patterned on quartz substrates to tolerances of 0.1 ums (by using commercial IC mask making E-beam tools) are used as the positioning reference at the reticle plane. These test reticles contain transmission alignment system slits 226 (FIGS. 14 and 19) on 10.0000 mm centers, distributed around the 160 mm circular field. Such a test reticle is placed onto each reticle chuck 125 and aligned to the in-column alignment references 134 at the top of each camera. Field stop assembly 121 is opened fully; shutters 97 are opened to illuminate the reticles. The in-stage calibration unit 227 is then moved to the nominal position of each projected image of each transmission alignment system slit 226 in image plane 30. Deviations from the true position are measured and recorded in the apparatus' calibration data base 33DB. Subsequent analysis (See Holbrook, above) determines the amount of X, Y, $\phi$ magnification and trapezoid errors found in each camera's projected images.

Using deductive models built into the system software which describe subsystem behavior and conversion methods, the proper adjustments for the six degree of freedom alignment chucks 130 are calculated (see lens discussion above for an example). The calculated adjustments are fed back to each of the six degree of freedom adjustment actuators (described above), so that the desired correction is made. This is again checked by successive measurements, using stage 11 and the in-stage calibration unit 227, until the residual noise level of error is achieved.

Note that not only is the size, placement and scale error for each image detected and corrected by this procedure for each camera, but the optical axis position of each camera can be determined from the data as well, and from this data the X and Y separation 3 of the two cameras can be determined. The absolute separation is not needed, only the relative separation as compared to the X and Y stage stepping distances. The above method determines this desired relationship, by using only one in-stage detector 227 and stepping it around the image field of both lenses with the one stepping grid of stage 11. The correction needed in camera separation distance 3 is used to offset the X origin of the right-hand camera's six degree of freedom stage 130. Using this method, both projected images are precisely matched to the grid of the stages, and their separation is precisely set to match the desired 165.000 mm distance of the X-axis of stage 11X travel. This leaves the tool properly corrected and ready for use in making LAED's.

The second phase of calibration occurs at power up. Each time the apparatus is powered up corrections must be made. This is because some knowledge about exact machine status may have changed during power down. As has already been discussed, velocity of light (VOL) correction must be checked in such situations. Each of the actuators in the system contains a small built-in origin sensor, with repositioning capability of roughly 1.0 micron. These sensors serve to reestablish the machine relationships near to the desired, corrected settings. In addition, all offsets stored in the machine databases 32DB and 33DB are stored on hard disk and, therefore, available upon power up. These are used to offset all actuators by the last measured value. Thus, only one iteration of testing using the grid plate and in-stage calibration unit 227 is required upon power up to restore all corrections. In this way the machine is quickly and easily restored to its corrected performance.

The third phase of calibration occurs during routine operation, when added corrections may be needed. In particular, a panel scaling capability may be needed. The above calibration assures that the coordinate systems of the two projected images and the X, Y stage coordinate system are aligned with sufficient precision to allow practical integration of their images into panel circuit patterns, such as FPD's. However, subsequent panel process steps may cause the X, Y scale of the panel to change. For example, an added layer of aluminum can stress the substrate, causing it to shrink or expand; glass is an amorphous material and will change dimensions significantly as it undergoes temperature cycling in the normal process of depositing and etching panel layers.

Consequently, for subsequent panel layers, it is desireable to measure the X, Y scale of each panel substrate and adjust the system again, this time to the scale of each panel. The transmission alignment system and reflective alignment system alignment systems can be used to make the panel scale measurement, as described above. This data can then be used by the system computer to add a final correction to the X, Y stage database, and to make a final trim adjustment of the column magnification and the column spacing in database 33DB, so that the scale of the new layer is matched to the X, Y scale of the individual panel substrate. In this manner, the images for the new layer will be placed most accurately above previous layers (FIG. 5). The capability for measuring and making panel scale adjustments for each panel substrate already exists in the system, because the above calibration must be provided for successful two column operation. Here, it is used for an additional purpose, to improve the performance of the tool in real production, by providing the panel scale feature as well.

Finally, alignment of upper layers of printed images to earlier layers is needed. When substrates are loaded onto the X, Y stages, their orientation will not be exact. Using either the transmission alignment system or reflective alignment system alignment systems, this misorientation can be measured. The X and Y position error will be used to offset the stepping grid by the correct amount, so that the new layer of images falls on top of the prior layers. However, usually the panel substrate will also be misaligned in $\phi$ (rotation).

In the past wafer aligners have provided a $\phi$ stage just for final rotation adjustment of the substrate, after alignment. On most stepping aligners, this motion is placed between the X, Y stage metrology and the substrate. This extra mechanical linkage causes loss of metrology accuracy and precision, and detracts from throughput, since it is usually a flexible, hence vibrationprone subsystem. It detracts substantially from the accuracy needed for LAED's. The apparatus in our invention has eliminated the separate $\phi$ stage, and employs instead the $\phi$ correction built into the Y axis stage guidance to rotate the entire stage for the $\phi$ correction needed. The mechanical banking used to pre-align each plate as it is loaded will align plates within 5.0 ums. So only small $\phi$ corrections are needed. This precision of prealignment is achievable with panel substrates because they are square or rectangular, not round like wafers, and, because they are large, there is over 30 cm between reference points used for pre-alignment.

Rotating the stage yaw correction deliberately out of yaw alignment to correct for plate rotation errors, is one method by which the panel substrate may be brought into $\phi$ alignment. Resulting X, Y positioning errors can be calculated from the known yaw rotation command, and entered into the X, Y stage calibration database, as added X, Y offsets. In this way a more rigid, higher throughput, lower cost system design is achieved without decreasing alignment performance.

An alternate method for correcting substrate 1 misalignment to the X and Y axes is to rotate each camera's six degree of freedom alignment chuck 130 by the measured alignment error angle $\phi$, thereby aligning each image to the orientation of the images on the substrate. The X and Y origin for each camera will also need to be adjusted in X and Y by moving chucks 130, so that a line connecting the optical axes of the two cameras is brought into $\phi$ alignment as well. Finally, since the plate is misoriented with respect to the X and Y axes of the machine, a "stair-step" stepping pattern will need to be executed, so that the actual stepping pattern of the stages 11 is made parallel to the orientation of the images on the substrate.

The procedure used to align substrates, once a single patterned layer has been created on the substrate, has been described above. The data acquired during the alignment process is used by the system control computers to modify the stepping pattern so that the new layer being printed is placed as exactly as possible on top of the existing layer or layers. Shifting the X, Y stepping array in X, Y to overlay the prior layer is a well known practice. However, the methods used here to correct for $\phi$, panel scale, and orthagonality error are novel.

In these ways alignment is achieved for both intrafield and inter-field relationships, even when subsequent layers are distorted in panel scale and improperly placed on stage 11Y.

8. Automation of Calibration and Corrections

The apparatus and methods described above are controlled by a system computer. All data collection methods and precision adjustments are included in the software and, so, are automatic. This allows the user to repeat the complex calculation procedure quickly and precisely, without a high level of skill. It also allows the user to maximize productive uptime, since complex calibration sequences are handled automatically by the computer.

The flow chart in FIG. 5 illustrates the use of these procedures during normal operations, such as power up 43, stage corrections 32, camera corrections 33, first level patterning 41, and upper level patterning 42.

Correction data is stored in data bases 32DB and 33DB for the X, Y motions and the cameras, respectively. The data consists of coordinate offsets and scaling coefficients which are used to correct each subsystem so that its operation will be within the desired tolerances. More generally, the data consists of mathematical arrays (matrices).

Models of subsystem behavior are also kept in these databases. For example, the function which describes the nontelecentricity of each lens 13 or 15 is stored in database 33DB and is used to convert a desired magnification change (expressed in %) into motion increment commands (expressed in microns) for drives 84. Since drives 84 are voltage driven devices, the function that accurately converts motion increment commands (in microns) into volts for drive 84 is also included in the data of database 33DB. More generally, these functions are known as transfer functions, because they transfer one set of commands into another set, with offset, scale, and unit-of-measure conversions being accomplished in the process. Since the input data is often a matrix of numbers, these transfer functions are also generally expressed as mathematical arrays (matrices).

Database 32DB contains the correction data and the transfer functions for the X and Y stages. The primary input for this database comes from the stage correction procedure 32. Information which modifies this database comes from VOL and stage $\phi$ origin measurements 38, panel alignment and scale measurements 48, and from real time stage $\phi$ control 34.

Database 33DB contains the correction data and the transfer functions for each camera. The primary input for this database comes from the camera correction procedure 33. Updates come from reticle selection 45, VOL measurements 38, and autofocus 35.

All control of the apparatus is accomplished through user interface 39 in the form of job commands, which are then stored in the job command file 40. Commands may be typed in via a computer keyboard or may be entered via a programmable touch panel. Generally, complex engineering control is via the computer keyboard, while routine operating commands, such as "Start," are entered by touching the displayed graphic on the programmable touch panel. An exception is the powerup routines. Upon powerup, the apparatus automatically executes a set of startup commands that include normal computer diagnostic checks, safety and utility checks, ending with the initialization of each subsystem on the apparatus.

Next procedure 38, measuring VOL and aligning the stage $\phi$ origin, takes place, so that these critical trim adjustments can be made. To measure the current index of refraction of air (the VOL correction), mark 228B on scale 205 is brought under reflective alignment system unit 241 and its Y-axis location is measured. The stages 11 then move the known distance to mark 228F. This distance is calculated from data and functions in database 32DB, namely, the known length of scale 205, and a prior transfer function used to convert interferometer fringe counts into millimeters of motion. Using this process, mark 228F is brought under reflective alignment system unit 241, and the Y-axis location of mark 228F is also determined. From prior calibrations the desired length between marks 228B and 228F is known and stored in database 32DB. Since scale 205 is made of a material such as Zerodur, which does not change its dimension with time or with air pressure, etc., any measured length difference is assumed to be due to a change in air index, due to pressure changes (or any other index changing variable, such as temperature, humidity, etc.). The measured error in the length of scale 205 is therefore used to alter the VOL scaling factor in the stage transfer function, so that the computed nominal distance and the actual measured distance from mark 228B to mark 228F become the same.

On power up, process step 38 causes the yaw drive 200 to set the stages to a nominal origin for stage $\phi$ (rotation about Z). When compared to a line connecting the optical axes of lenses 13 and 15, the stages may be at a slightly different $\phi$ orientation each time the apparatus is started up. This residual error, however, will be removed by step 33, where the cameras are recalibrated to match the new $\phi$ orientation of the stages.

At this point stage correction procedure 32 may be run. Generally, however, the VOL correction is adequate, assuming that the stages have been corrected once, at some prior date. If, however, the stage correction procedure is to be rerun, one would load a grid calibration plate onto stage 11Y and begin procedure 32. Each grid plate contains an array of reflective alignment system marks 228 on a stable substrate, such as Zerodur. The corrected location of each mark on the grid plate is known and is already in database 32DB, from prior calibrations. The X and Y stages are moved from mark to mark by stepping the exact distance contained in database 32DB. Reflective alignment system unit 241 then measures any residual error in the location of each mark. Measured deviations are assumed to be errors in the current X, Y stepping distances. These errors are stored as an array of correction values and become a transfer function, used to modify later commanded stepping distances so that an accurate distance is stepped.

Procedure 33, the camera correction procedure, uses the X, Y motions as a local measuring machine. The best performance is achieved if the stage correction procedure 32 has been done first, as just described. Test reticles 117, which contain an array of transmission alignment system slits 226 on them are loaded onto chucks 125 on each camera and aligned to the in-column alignment references 134. The shutter 97 is opened, in-stage calibration unit 227 is raised to image plane 30. Sensor 23 is moved around each projected image until the location of the image of each slit 226 is measured. Offset and scale of each projected image can be determined from this process. The distance between each camera is also determined. In this way each camera's projected images are matched to the X, Y stepping distances and angles.

At this point the apparatus is fully adjusted and is ready to pattern substrates. First level patterns differ from upper level patterns in that first level patterns do not have any pattern on the substrate yet. So no alignment to the substrate is possible. After loading substrate 1 and banking it against pins 187, using banking chuck 189, the X, Y stages are stepped to each desired exposure location directly, using (see step 46) the transfer function from data base 32DB to modify commanded stepping distances as required by earlier VOL updates (38) and calibration corrections (32). In this manner each exposure is placed in its desired, accurate location.

Upper level patterns require that the new pattern be placed precisely and accurately above the prior layers of patterning. This means that the earlier layer(s) must be first located. As described earlier, offset and scale errors are expected and are corrected for. By using either the transmission alignment system 225 or the reflective alignment system alignment system 241, prior level patterns are located in the coordinate system of stages 11, as has been described. The data gathered during the alignment process is used (step 49) to modify the transfer functions in both databases. For example, if a panel scale change of +2.0 ums over 200 mm occurred, as measured during alignment step 48, the X and Y stepping distance transfer function is modified to alter its scaling function accordingly. Assume that the job commands 40 call for 5 steps across the measured distance of 200 mm. In this case each step is increased by +0.4 ums, thereby providing a +2.0 ums correction across the full distance and matching the new stepping pattern exactly to the underlying, expanded pattern. Note, in the above example, that the spacing between the optical images must also be adjusted using chuck 130. Since the optical image spacing is generally 165 mm, it must be increased by +1.65 um, which is accomplished by adding an offset to database 33DB, which in turn offsets the origin of the six degree of freedom reticle alignment system 130, so that the proper spacing 3 is provided to exactly match the substrate's new scale. Similarly, the magnification must be adjusted +0.001% so that the 40 mm image being stepped is increased to 40.004 mm to match the new stepping distance. Once these modifications (see step 49) have been made in the databases, the revised databases are used to modify job commands (in our example changing the 40.000 mm stepping distance to 40.004 mm), as the job is executed, again creating a new pattern level which is precisely and accurately matched to the underlying layer(s). In this manner, the apparatus described herein is maintained in calibration and used to step image arrays with the degree of control required to produce large arrays of electronic devices (such as thin film transistors) on amorphous substrates.

We claim:

1. Apparatus to project images from reticles onto the photosensitive surface of a single common substrate to produce a large scale integrated image upon said substrate, said apparatus including a movable stage for holding said substrate, means for stepping said stage in the x- and y-directions, stage calibration means to calibrate the position of said stage in different stepped positions and to determine a stage transfer function incorporating said calibration data, a pair of parallel optical systems for concurrently projecting dual images upon said substrate, said systems having optical axes in the z-direction, each said optical system including a projection imaging system, an illumination system, a reticle carrier to carry said reticles, and a reticle chuck positioned to receive said reticles one at a time from said reticle carrier and to hold each said reticle within said illumination system during projection of an image carried by said reticle, each said reticle chuck being capable of individual adjustment movement in at least the x-, y-, z-, and $\phi$-directions, reticle calibration means associated with each said reticle chuck to calibrate the position of a said reticle in said chuck relative to said stage and to determine a reticle transfer function incorporating said calibration data, a computer associated with said stepping means and said optical systems for controlling same, said computer storing said stage transfer function and said reticle transfer functions and utilizing same to adjust said stepping means and said reticle chuck prior to each said image projection, whereby said projected images will be properly aligned relative to one another to produce a unitary, integrated image on said photosensitive surface.

2. Apparatus to project images from reticles as set forth in claim 1 in which said stage transfer function is an algorithm incorporating the variations of motion of said stage from theoretically true positions.

3. Apparatus to project images from reticles as set forth in claim 1 in which said reticle transfer functions are algorithms incorporating the adjustments required to be made in the positions of said reticle chucks so that the projected image is correct in magnification, rotation, size and position.

4. Apparatus to project images from reticles as set forth in claim 1 in which said reticle chucks are capable of adjustment over six degrees of freedom.

5. Apparatus to project images from reticles as set forth in claim 4, said apparatus including an asymmetric lens in each said optical system, each said projection imaging system having magnification adjustment capability on its reticle side and telecentric focus adjustment capability on its substrate side, and each said optical system including means for adjusting the spacing between said lens and said substrate, whereby adjustment of said spacing focusses said lens and z-adjustment of said reticle chuck relative to said lens adjusts said magnification and each projected image can be adjusted for size, shape, angular orientation, and position.

6. Apparatus to project images from reticles as set forth in claim 1, each said illumination system including a folding mirror to alter the direction of light before it enters each said lens, whereby said projection imaging systems may be positioned proximate to one another.

7. Apparatus to project images from reticles as set forth in claim 1 including means to measure the distance between each said projection imaging systems and the surface of said substrate and to vary said distance prior to the projection of each image, whereby said spacing can be adjusted to maintain said image in focus regardless of unevenness of said surface.

8. Apparatus to project images from reticles as set forth in claim 1 in which said stage stepping means includes a pair of linear motors, one of which is positioned to move the stage in one direction and the other of which is positioned to move the stage in an orthogonal direction.

9. Apparatus to project images from reticles as set forth in claim 1 in which said stage includes banking pins and a vacuum chuck to receive and position said substrate, said vacuum chuck being biased to press said substrate towards said banking pins, whereby said substrate can be initially positioned in said stage.

10. Apparatus to project images from reticles as set forth in claim 1 including means to vary the spacing between said two optical axes.

11. Apparatus to project images from reticles as set forth in claim 1 including means for measuring the intensity of the said image projected from each said reticle and for varying the exposure to provide equal exposure dosages to said photosensitive surface from each said reticle.

12. Apparatus to project images from reticles onto the photosensitive surface of a single common substrate to produce a large scale integrated image upon said substrate, said apparatus including a movable stage for holding said substrate, means for stepping said stage in orthogonal directions in the plane of said substrate, a pair of parallel optical systems mounted proximate to said substrate for concurrently projecting dual images upon said glass substrate, said systems having optical axes perpendicular to said substrate, each said optical system including a reticle carrier to carry said reticles and a reticle chuck positioned to receive said reticles one at a time from said reticle carrier and to hold each said reticle during projection of an image carried by said reticle, each said reticle chuck being capable of individual adjustment movement in six degrees of freedom, a computer associated with said stepping means and said optical systems for controlling same, said computer storing data pertaining to the relative positions of said stage and each said reticle and utilizing same to adjust said stepping means and said reticle chuck prior to each said image projection, whereby said projected images will be properly aligned relative to one another to produce a unitary, integrated image on said photosensitive surface.

13. Apparatus to project images from reticles as set forth in claim 12 in which each said optical system includes mirror means for altering the light path, whereby projection lenses may be positioned more proximate to one another.

14. Apparatus to project images from reticles as set forth in claim 12 including alignment marks on said reticles and sensing means in said stage for sensing said alignment marks as they are projected from said reticles.

15. Apparatus to project images from reticles as set forth in claim 14 in which said sensing means is a pop-up sensor adapted to move between a position corresponding to the level of the upper surface of substrate and a level below the lower surface of said substrate.

16. Apparatus to project images from reticles as set forth in claim 12 including a reflective alignment microscope associated with at least one of said optical columns, whereby said substrate can be aligned prior to projecting a second layer of images thereupon.

17. Apparatus to project images from reticles as set forth in claim 12 including means for adjusting the positions of said reticles to compensate for variations in magnification and/or focus caused by variations in the index of refraction of the surrounding air affecting the velocity of light.

18. Apparatus to produce large scale integrated images on the photosensitive surface of a substrate, said apparatus including a movable stage, means for stepping said stage in the x-and y-directions, a pair of parallel and proximate optical systems having axes in the z-direction and positioned above said stage for projection of images thereupon, said optical systems including a reticle chuck operatively associated with each said optical system, for carrying reticles bearing alignment marks to be projected upon said stage, sensing means for comparing the position of said projected alignment marks on said stage as said stage is stepped throughout its movement range beneath said optical systems and for determining and recording the extent of variation of said stage from its theoretically true x-, y-, and $\phi$-positions throughout said range, and means for varying the stepping of said stage from theoretical stepping distances to compensate for said variation in each position of said stage within said range, whereby images formed upon said photosensitive surface will accurately abut with one another.

19. Apparatus to produce large scale integrated images as set forth in claim 18 in which said sensing means includes a plurality of sensors mounted in said stage.

20. Apparatus to produce large scale integrated images as set forth in claim 19 in which at least one of said sensing means is adapted to move between a position corresponding to the upper surface of said substrate and a retracted position.

21. Apparatus to produce large scale integrated images as set forth in claim 18 including control means for each of said reticle chucks, said control means being adapted to vary the position of said chuck to adjust the position of said image to compensate for said variation in the said positions of said stage.

22. Apparatus to produce large scale integrated images as set forth in claim 18 in which said reticle chucks have six degrees of freedom of movement.

23. Apparatus to produce large scale integrated images as set forth in claim 18 including a sensor for each said optical system to detect the distance of the lens in said system from said photosensitive surface and means to maintain said lens at a constant distance from said surface, whereby said lenses in said optical system will be maintained in focus as said stage is moved regardless of variations in height of said surfaces.

24. Apparatus for making large area electronic devices utilizing horizontal alignment of images from two optical systems, said apparatus including a movable stage adapted for motion in x- and y-directions, a pair of parallel and proximate optical systems having axes in the z-direction and positioned to receive reticles in their object planes and to project images from said reticles upon said stage, a reticle carrier associated with each said optical system and a reticle alignment chuck associated with each said reticle carrier and adapted to receive a reticle from its respective said carrier and to hold said reticle in the object plane of its respective said optical system, and alignment means associated with said optical systems including (i) control means associated with each said reticle chuck for adjusting same in any of six degrees of freedom, (ii) means for varying the distance between said optical axes, and (iii) means for varying the magnification of said optical systems, whereby images projected by each said optical systems may be butted with one another and with images from the other of said system to produce large scale images suitable for said displays.

25. Apparatus for making large area electronic displays as set forth in claim 24 in which each said optical system includes an asymmetric telecentric lens.

26. Apparatus for making large area electronic displays as set forth in claim 24 in which said reticle carriers are adapted to carry a plurality of said reticles, and means for individually interchanging said reticles in said chuck.

27. Apparatus for making large area electronic displays as set forth in claim 24 including step and repeat means to move said stage distances equal to one dimension of said projected images, and means for so aligning said reticle alignment chucks during each said step that immediately preceding projected said images will abut with images projected in each said new position.

28. Apparatus for forming abutting images upon the photosensitive surface of a substrate, said images serving to form a display, said apparatus including a movable stage for holding said substrate, said stage including preliminary alignment means for said substrate, a pair of reticle chucks adapted to receive and hold reticles for projection upon said substrate, a light source and an optical system associated with each said chuck positioned to simultaneously project an image from each of said reticles held by said chucks upon different portions of said substrate, said optical systems having parallel optical axes, and means for adjusting the relative positions of said chucks and said optical systems so that multiples of said images are abutting and in alignment upon said substrate, whereby said images form a continuum with one another upon said substrate.

29. Apparatus for forming abutting images as set forth in claim 28 in which said continuum is a single integrated image on said substrate.

30. Apparatus for forming abutting images as set forth in claim 28 including a stepper associated with said stage adapted to move said stage in a direction paralleling a line connecting said optical axes for a distance commensurate with said images sizes, whereby said images may be repeated upon portions of said photosensitive surface contiguous with said first images.

31. Apparatus for forming abutting images as set forth in claim 30 in which the line between said optical axes is in the x-direction and said stepper operates in both the x- and y-directions.

32. Apparatus for forming abutting images as set forth in claim 28 in which said means for adjusting the relative positions of said carriers and said stage include step and repeat means to move said stage a distance substantially equal to one dimension of said projected images.

33. Apparatus for forming abutting images as set forth in claim 28 in which the spacing between the images of said optical systems leaves a remainder space and including a reticle image to fill and abut said space

34. Apparatus for forming abutting images as set forth in claim 28 including reticle carriers to carry a plurality of reticles and means for transferring said reticles between said carriers and said chucks.

35. Apparatus for forming abutting images as set forth in claim 28 including means associated with said optical systems for adjusting the distances of the respective said optical systems from said substrate to maintain constant distances from the surfaces of said substrate.

36. Apparatus for forming abutting images as set forth in claim 28 including laser interferometer means for determining the axial spacing between said optical systems.

37. Apparatus for producing large area electronic devices and having rapid throughput, said apparatus including a frame, a stage carried by said frame for motion in x- and y-directions, said stage being adapted to hold a substrate, a pair of parallel and proximate optical systems having lenses with their axe in the z-direction and positioned to project images upon said substrate held by said stage, sensors associated with said stage for determining the x-, y-, and $\phi$-positions of said stage relative to said optical systems, a pair of reticle alignment chucks mounted on said frame, each said chuck being operatively associated with one of said optical systems, said reticle chucks being capable of adjustment in six degrees of freedom, a stage alignment function providing coordinates of motion of said stage relative to each said reticle chuck, stepping means for said stage, and control means to adjust the position of said reticle chucks in accordance with said stage alignment function, whereby multiple abutting images can be projected through said optical systems to create a uniform, integral image upon said substrate.

38. Apparatus for producing large area electronic devices as set forth in claim 37 including sensors for determining the relative axial positions of said lenses whereby said control means can adjust the position of said reticle chucks in accordance with said relative positions.

39. Apparatus for producing large area devices as set forth in claim 38 in which said lens position detectors are laser interferometers.

40. In an apparatus adapted to project simultaneous images, from reticles carried by a pair of parallel optical columns, upon a common substrate, to produce a single unified image, said columns being mounted with axes perpendicular to a stage carrying a substrate, said stage being adapted for stepping motion in x- and y- directions orthogonal to the axes of said columns, that improvement including an asymmetric projecting lens in each said optical column for projecting said images, each said lens having magnification adjustment capability on its reticle side and focus adjustment capability on its substrate side, and separate means for each said lens for adjusting the axial spacing between said lenses and said substrate and separate means for each said lens for adjusting the spacing between said lenses and said reticles, whereby the focus and magnification of each said lens can be independently adjusted for better alignment of said projected images.

41. In an apparatus adapted to project simultaneous images as set forth in claim 40, that further improvement including means for measuring the velocity of light and further means for adjusting the spacing of the lens from the substrate to adjust for focus changes based upon changes in said velocity of light.

42. In an apparatus adapted to project simultaneous images as set forth in claim 41 in which said means for adjusting for focus changes is an alignment chuck adapted to carry said reticle and having six degree of freedom of movement.

43. In an apparatus as set forth in claim 40, a folding mirror within said optical columns whereby light therein will be redirected permitting said axes to be positioned adjacent to one another.

44. In an apparatus adapted to project simultaneous images upon a common substrate, from reticles carried by a pair of optical columns having illuminators and lenses therein, to produce a unified image, said lenses being mounted with their axes parallel and perpendicular to a stage carrying said substrate, said stage being orthogonal to the axes of said lenses, that improvement including a folding mirror within said optical columns between said lenses and said condensers to redirect the light from said illuminator to said lenses, whereby said lenses may be positioned proximate to one another.

45. In an apparatus adapted to project simultaneous images, from reticles carried by a pair of parallel optical columns, upon a common substrate, to produce a single unified image, said columns being mounted with axes perpendicular to a stage carrying a substrate, said stage being adapted for stepping motion in orthogonal directions perpendicular to the axes of said columns, that improvement including an asymmetric projecting lens in each said optical column for projecting said images, each said lens having magnification adjustment capability on its reticle side and focus adjustment capability on its substrate side, a reticle chuck in each said optical column positioned to hold a reticle during projection of a said image, each said reticle chuck being independently adjustable in six degrees of freedom to permit positioning of said reticle for control of magnification, rotation, size and shape, and control means to control the adjustment of each said reticle, whereby images from each said optical column can be adjusted independently to permit proper alignment for the creation of a single integral image on said substrate formed from multiple simultaneous images projected from said two columns.

46. In an apparatus as set forth in claim 45 in which said reticles chucks are adjusted prior to each exposure.

47. In an apparatus as set forth in claim 45 in which said reticles chucks are adjusted upon power-up.

48. In an apparatus adapted to project simultaneous images as set forth in claim 45, that improvement in which said control means adjusts the said reticles during the period between each said simultaneous projection and each stepping of said stage.

49. The method of making displays on a photo-sensitive coated substrate carried by a movable stage, and using a pair of parallel optical columns with axes perpendicular to said stage, including the steps of positioning said substrate on said stage, simultaneously projecting a pair of aligned images, one from each of said optical systems upon said stage, stepping said stage a predetermined distance in a given direction and thereafter again projecting said images upon said substrate, each of said new images being in abutting and aligned relationship with one of said previously projected images, and repeating said stepping and projecting steps until said substrate carries an integral image layer formed of a plurality of said abutting images, whereby one layer of an integral display has been projected upon said photosensitive substrate.

50. The method of making displays as set forth in claim 49 including the step of moving said stage in a direction orthogonal to said given direction.

51. The method of making displays as set forth in claim 49 including the step of adjusting the size of said aligned images such that no remainder space remains between the totalities of images projected by the two said optical systems.

52. The method of making displays as set forth in claim 49 including the step of projecting a remainder image.

53. The method of making displays a set forth in claim 49 including the step of adjusting the exposures of the two said images to make them equal.

54. The method of making displays as set forth in claim 49 including the steps of etching said photoresist and recoating it, positioning said substrate upon said stage, aligning it to receive a second image, and thereafter simultaneously projecting said second image on said substrate, stepping and repeating it as before, to create a second integral image layer on said substrate.

55. The method of making displays a set forth in claim 49 including the step of panel scaling, aligning it to receive a second image, and thereafter simultaneously projecting said second image on said substrate, stepping and repeating it as before, to create a second integral image layer on said substrate.

56. The method of correcting for variations in translatory movement of a movable stage used in apparatus for making displays, said apparatus including a pair of parallel and proximate optical columns to project images upon a substrate carried by said stage, said method including determining the actual positions of said stage as it is moved throughout its range of movement, determining the apparent position of said stage as determined by projecting images from said optical columns to sensors on said stage, comparing the differences between said actual and apparent positions and recording them as a transfer function, and varying the position of said stage relative to said optical columns in accordance with said transfer function, whereby images projected by said optical columns upon said substrate will accurately abut.

57. The method of aligning multiple images being projected from a reticle to a photo-sensitive coated substrate using a pair of parallel and proximate optical systems, said systems being positioned to project in the z-direction upon a movable stage subject to controlled motion in the x-, y-, and $\phi$ directions, said method including the steps of determining the coordinates of motion of said stage relative to images projected from said reticles, determining the reticle coordinates of each said reticle by projection of images upon sensors positioned in known locations in said stage, using said determined coordinates of said stage and said determined reticle coordinates to determine a first transfer function for said system relative to positions of said stage, positioning a said substrate in said stage and applying said first transfer function to adjust the relative positions of said reticles and said substrate for accurate image projection, and thereafter projecting an image upon said substrate, stepping said stage to a position to permit projection of an abutting image, and again applying said first transfer function to adjust the relative positions of said reticles and said substrate for accurate image projection, and thereafter projecting an image upon said substrate, and repeating the steps of stepping said stage, applying said first transfer function, and projecting said image until sufficient images have been projected upon said substrate to make up an integrated level of a display.

58. The method of aligning multiple images, as set forth in claim 57, including the steps of determining second reticle coordinates for a second reticle for each said optical system, developing said first layer of photo-resist and recoating said substrate, positioning said recoated substrate in said stage and determining the difference in alignment of said substrate on said stage relative to the initial alignment of said substrate to said stage to provide an alignment transfer function, using said determined stage coordinates, said determined second reticle coordinates, and said alignment transfer function to create a second transfer function for said system relative to positions of said stage, applying said second transfer function to adjust the relative positions of said second reticle and said substrate for accurate image projection, and thereafter projecting an image upon said substrate, stepping said stage to a position to permit projection of an abutting image on said substrate, and again applying said second transfer function to adjust the relative positions of said reticles and said substrate for accurate image projection, and thereafter projecting an image upon said substrate, and repeating the steps of stepping said stage, applying said second transfer function, and projecting said image until sufficient images have been projected upon said substrate to make up a second level of a display.

59. A flat panel display containing a multiplicity of repetitive stitched images and a plurality of layers, said display including a substrate, a plurality of aligned, etched layers formed using photoresist material upon said substrate, each of said layers having been formed by simultaneous projection of images upon said photoresist material from a reticle carried in each of at least a pair of optical columns, said images each covering a small portion of said substrate but having been repeatedly stepped and reprojected from each said optical column over said substrate so as to form a continuum of interfitting images to form a total, unitary image on said photoresist of said layer, said images from each of said optical columns having been separately adjusted before each stepping and projection to match and abut one another in respect to size, shape, rotation, and magnification, whereby said flat panel display is formed of a plurality of unitary, integral layer of circuitry.

60. A flat panel display as set forth in claim 59 in which the dimensions of the images projected on layers of said photoresist after said first layer have been scale adjusted to compensate for dimensional changes in said preceding layer.

*61. Apparatus to project images from reticles onto the photosensitive surface of a substrate to produce a large scale integrated image upon said substrate, said apparatus including*

*a movable stage for holding said substrate, means for stepping said stage in the x- and y-directions, stage calibration means to calibrate the position of said stage in different stepped positions and to determine a stage transfer function incorporating said calibration data,*

*an optical system for projecting an image upon said substrate, said system having its optical axis in the z-direction, said optical system including a projection imaging system, an illumination system, a reticle carrier to carry said reticles, and a reticle chuck positioned to receive said reticles one at a time from said reticle carrier and to hold each said reticle within said illumination system during projection of an image carried by said reticle, said reticle chuck being capable of individual adjustment movement in at least the x-, y-, z-, and Φ-directions,*

*reticle calibration means associated with said reticle chuck to calibrate the position of a said reticle in said chuck relative to said stage and to determine a reticle transfer function incorporating said calibration data,*

*a computer associated with said stepping means and said optical system for controlling same, said computer storing said stage transfer function and said reticle transfer function and utilizing same to adjust said stepping means and said reticle chuck prior to each said image projection,* whereby said projected images will be properly aligned to produce a unitary, integrated image on said photosensitive surface.

*62. Apparatus to project images from reticles as set forth in claim 61 in which said stage transfer function is an algorithm incorporating the variations of motion of said stage from theoretically true positions.*

*63. Apparatus to project images from reticles as set forth in claim 61 in which said reticle transfer function is an algorithm incorporating the adjustments required to be made in the position of said reticle chuck so that the projected image is correct in magnification, rotation, size and position.*

*64. Apparatus to project images from reticles as set forth in claim 61, said apparatus including an asymmetric lens in said optical system, said projection imaging system having magnification adjustment capability on its reticle side and telecentric focus adjustment capability on its substrate side, and*

*said optical system including means for adjusting the spacing between said lens and said substrate,*

*whereby adjustment of said spacing focusses said lens and z-adjustment of said reticle chuck relative to said lens adjusts said magnification and each projected image can be adjusted for size, shape, angular orientation, and position.*

*65. Apparatus to project images from reticles onto the photosensitive surface of a substrate to produce a large scale integrated image upon said substrate, said apparatus including*

*a movable stage for holding said substrate, means for stepping said stage in orthogonal directions in the plane of said substrate,*

*an optical system mounted proximate to said substrate for projecting images upon said substrate, said system having an optical axis perpendicular to said substrate, said optical system including a reticle carrier to carry said reticles and a reticle chuck positioned to receive said reticles one at a time from said reticle carrier and to hold each said reticle during projection of an image carried by said reticle, said reticle chuck being capable of individual adjustment movement in at least four degrees of freedom,*

*a computer associated with said stepping means and said optical system for controlling same, said computer storing data pertaining to the relative positions of said stage and said reticle and utilizing same to adjust said stepping means and said reticle chuck prior to each said image projection,*

*whereby said projected image will be properly aligned to produce a unitary, integrated image on said photosensitive surface.*

*66. Apparatus to project images from reticles as set forth in claim 65 in which said sensing means is a pop-up sensor adapted to move between a position corresponding to the level of the upper surface of substrate and a level below the lower surface of said substrate.*

*67. Apparatus to project images from reticles as set forth in claim 65 including means for adjusting the positions of said reticles to compensate for variations in magnification and/or focus caused by variations in the index of refraction of the surrounding air affecting the velocity of light.*

*68. Apparatus to produce a large scale integrated image on the photosensitive surface of a substrate, said apparatus including*

*a movable stage, means for stepping said stage in the x- and y-directions,*

*an optical system having its axis in the z-direction and positioned above said stage for projection of images thereupon, said optical system including a reticle chuck operatively associated with said optical system for carrying reticles bearing alignment marks to be projected upon said stage,*

*sensing means for comparing the position of said projected alignment marks on said stage as said stage is stepped throughout its movement range beneath said optical system and for determining and recording the extent of variation of said stage from its theoretically true x-, y-, and Φ-positions throughout said range,*

*and means for varying the stepping of said stage from theoretical stepping distances to compensate for said variation in each position of said stage within said range,*

*whereby images formed upon said photosensitive surface will accurately abut with one another.*

*69. Apparatus to produce a large scale integrated image as set forth in claim 68 in which said sensing means includes a plurality of sensors mounted in said stage.*

*70. Apparatus to produce large scale integrated images as set forth in claim 68 in which at least one of said sensing means is adapted to move between a position corresponding to the upper surface of said substrate and a retracted position.*

*71. Apparatus to produce a large scale integrated image as set forth in claim 68 including*

*control means for said reticle chuck, said control means being adapted to vary the position of said chuck to adjust the position of said image to compensate for said variation in the said positions of said stage.*

*72. Apparatus for producing large area electronic devices and having rapid throughput, said apparatus including*

*a frame,*

*a stage carried by said frame for motion in x- and y-directions, said stage being adapted to hold a substrate,*

*an optical system having a lens with its axis in the z-direction and positioned to project images upon said substrate held by said stage,*

*sensors associated with said stage for determining the x-, y-, and Φ-positions of said stage relative to said optical systems,*

*a reticle alignment chuck mounted on said frame, said chuck being operatively associated with said optical system, said reticle chuck being capable of adjustment in at least four degrees of freedom,*

*a stage alignment function providing coordinates of motion of said stage relative to said reticle chuck,*

*stepping means for said stage, and*

*control means to adjust the position of said reticle chuck in accordanace with said stage alignment function,*

*whereby abutting images can be projected through said optical system to create a uniform, integral image upon said substrate.*

*73. The method of correcting for variations in translatory movement of a movable stage used in apparatus for making displays, said apparatus including an optical column to project images upon a substrate carried by said stage, said method including*

*determining the actual positions of said stage as it is moved throughout its range of movement,*

*determining the apparent position of said stage as determined by projecting an image from said optical column to sensors on said stage,*

*comparing the differences between said actual and apparent positions and recording them as a transfer function, and*

*varying the position of said stage relative to said optical column in accordance with said transfer function,*

*whereby images projected by said optical column upon said substrate will accurately abut.*

*74. The method of making displays as set forth in claim 73 including the step of panel scaling, aligning said stage to receive a second image, and*

*thereafter simultaneously projecting said second image on said substrate, stepping and repeating it as before, to create a second integral image layer on said substrate.*

*75. The method of aligning multiple images being projected from reticles to a photo-sensitive coated substrate using an optical system, said system being positioned to project in the z-direction upon a movable stage subject to controlled motion in the x-, y-, and Φ directions, said method including the steps of*

*determining the coordinates of motion of said stage relative to images projected from said reticles,*

*positioning a said substrate in said stage and thereafter projecting multiple abutting images upon said substrate,*

*determining reticle coordinates for a second said reticle for said optical system,*

*developing said photo-sensitive coated substrate and recoating said substrate,*

*positioning said recoated substrate in said stage and determining the difference in alignment of said substrate on said stage relative to the initial alignment of said substrate to said stage to provide an alignment transfer function,*

*using said determined stage coordinates, said determined second reticle coordinates, and said alignment transfer function to create a transfer function for said system relative to positions of said stage,*

*applying said last-named transfer function to adjust the relative positions of said second reticle and said substrate for accurate image projection, and thereafter projecting an image upon said substrate,*

*stepping said stage to a position to permit projection of an abutting image on said substrate, and again applying said transfer function to adjust the relative positions of said reticles and said substrate for accurate image projection, and thereafter projecting an image upon said substrate, and*

*repeating the steps of stepping said stage, applying said second transfer function, and projecting said image until sufficient images have been projected upon said substrate to make up a second level of a display.*

* * * * *